(12) United States Patent
Thuries et al.

(10) Patent No.: US 10,247,547 B2
(45) Date of Patent: Apr. 2, 2019

(54) OPTICAL PATTERN PROJECTOR

(71) Applicant: Hand Held Products, Inc., Fort Mill, SC (US)

(72) Inventors: Serge Thuries, Saint Jean (FR); Alain Gillet, Galan (FR); Bernard Puybras, Saint Pierre de Lages (FR)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 0 days.

(21) Appl. No.: 15/837,579

(22) Filed: Dec. 11, 2017

(65) Prior Publication Data

US 2018/0100733 A1    Apr. 12, 2018

Related U.S. Application Data

(63) Continuation of application No. 14/747,197, filed on Jun. 23, 2015.

(51) Int. Cl.
*G01B 11/25* (2006.01)
*G02B 27/09* (2006.01)
(Continued)

(52) U.S. Cl.
CPC .............. *G01B 11/25* (2013.01); *G01B 11/02* (2013.01); *G02B 3/0056* (2013.01);
(Continued)

(58) Field of Classification Search
CPC ................ G02B 27/0961; G02B 27/30; G02B 27/0977; F21V 5/007; F21V 5/045;
(Continued)

(56) References Cited

U.S. PATENT DOCUMENTS 3,971,065 A    7/1976   Bayer
4,026,031 A    5/1977   Siddall et al.
(Continued)

FOREIGN PATENT DOCUMENTS

AU    2004212587 A1    4/2005
CN    201139117 Y    10/2008
(Continued)

OTHER PUBLICATIONS

Ulusoy, Ali Osman et al.; "One-Shot Scanning using De Bruijn Spaced Grids", Brown University; 2009 IEEE 12th International Conference on Computer Vision Workshops, ICCV Workshops, pp. 1786-1792 [Cited in EPO Search Report dated Dec. 5, 2017}.
(Continued)

*Primary Examiner* — Mohamed K Amara
(74) *Attorney, Agent, or Firm* — Additon, Higgins & Pendleton, P.A.

(57) ABSTRACT

An optical pattern projector used for projecting a structured-light pattern onto an object for dimensioning is presented. The optical pattern projector utilizes a laser array, a lenslet array, a lens, and a diffractive optical element to create a repeated pattern of projected dots. The pattern repetition is based on the grid pattern of laser array. Each laser's collimated beam, when projected through the lens, impinges on the diffractive optical element from a slightly different direction. The diffractive optical element creates a sub-patterns that continue propagating along these different directions and combine on a target to produce a repeating optical pattern.

20 Claims, 3 Drawing Sheets

(51) Int. Cl.

| | |
|---|---|
| *G01B 11/02* | (2006.01) |
| *G02B 3/00* | (2006.01) |
| *G02B 27/42* | (2006.01) |
| *H01S 5/42* | (2006.01) |
| *G02B 27/10* | (2006.01) |
| *G02B 27/20* | (2006.01) |
| *G02B 13/00* | (2006.01) |

(52) U.S. Cl.
CPC ..... *G02B 27/0944* (2013.01); *G02B 27/0961* (2013.01); *G02B 27/106* (2013.01); *G02B 27/1093* (2013.01); *G02B 27/20* (2013.01); *G02B 27/4233* (2013.01); *H01S 5/423* (2013.01); *G02B 13/0005* (2013.01)

(58) Field of Classification Search
CPC ........... F21V 5/08; G03B 15/06; H01S 5/423; G01B 11/2513
See application file for complete search history.

(56) References Cited

U.S. PATENT DOCUMENTS

| | | | |
|---|---|---|---|
| 4,279,328 A | 7/1981 | Ahlbom | |
| 4,398,811 A | 8/1983 | Nishioka et al. | |
| 4,495,559 A | 1/1985 | Gelatt, Jr. | |
| 4,730,190 A | 3/1988 | Win et al. | |
| 4,803,639 A | 2/1989 | Steele et al. | |
| 4,914,460 A | 4/1990 | Caimi et al. | |
| 4,974,919 A * | 12/1990 | Muraki | G03F 7/70075 353/122 |
| 5,111,325 A * | 5/1992 | DeJager | G02B 13/0005 359/206.1 |
| 5,175,601 A | 12/1992 | Fitts | |
| 5,184,733 A | 2/1993 | Amarson et al. | |
| 5,198,648 A | 3/1993 | Hibbard | |
| 5,220,536 A | 6/1993 | Stringer et al. | |
| 5,243,619 A * | 9/1993 | Albers | G02B 3/06 359/489.09 |
| 5,331,118 A | 7/1994 | Jensen | |
| 5,359,185 A | 10/1994 | Hanson | |
| 5,384,901 A | 1/1995 | Glassner et al. | |
| 5,477,622 A | 12/1995 | Skalnik | |
| 5,548,707 A | 8/1996 | LoNegro et al. | |
| 5,555,090 A | 9/1996 | Schmutz | |
| 5,561,526 A | 10/1996 | Huber et al. | |
| 5,590,060 A | 12/1996 | Granville et al. | |
| 5,592,333 A * | 1/1997 | Lewis | G02B 5/045 359/619 |
| 5,606,534 A | 2/1997 | Stringer et al. | |
| 5,619,245 A * | 4/1997 | Kessler | B41J 2/45 347/237 |
| 5,655,095 A | 8/1997 | LoNegro et al. | |
| 5,661,561 A | 8/1997 | Wurz et al. | |
| 5,699,161 A | 12/1997 | Woodworth | |
| 5,729,750 A | 3/1998 | Ishida | |
| 5,730,252 A | 3/1998 | Herbinet | |
| 5,732,147 A | 3/1998 | Tao | |
| 5,734,476 A | 3/1998 | Dlugos | |
| 5,737,074 A | 4/1998 | Haga et al. | |
| 5,748,199 A | 5/1998 | Palm | |
| 5,767,962 A * | 6/1998 | Suzuki | G01N 21/94 356/237.2 |
| 5,802,092 A * | 9/1998 | Endriz | B41J 2/45 359/622 |
| 5,808,657 A * | 9/1998 | Kurtz | B41J 2/451 347/239 |
| 5,831,737 A | 11/1998 | Stringer et al. | |
| 5,850,370 A | 12/1998 | Stringer et al. | |
| 5,850,490 A | 12/1998 | Johnson | |
| 5,869,827 A | 2/1999 | Rando | |
| 5,870,220 A | 2/1999 | Migdal et al. | |
| 5,900,611 A | 5/1999 | Hecht | |
| 5,923,428 A | 7/1999 | Woodworth | |
| 5,929,856 A | 7/1999 | LoNegro et al. | |
| 5,938,710 A | 8/1999 | Lanza et al. | |
| 5,959,568 A | 9/1999 | Woolley | |
| 5,960,098 A | 9/1999 | Tao | |
| 5,969,823 A | 10/1999 | Wurz et al. | |
| 5,978,512 A | 11/1999 | Kim et al. | |
| 5,979,760 A | 11/1999 | Freyman et al. | |
| 5,988,862 A | 11/1999 | Kacyra et al. | |
| 5,991,041 A | 11/1999 | Woodworth | |
| 6,009,189 A | 12/1999 | Schaack | |
| 6,025,847 A | 2/2000 | Marks | |
| 6,035,067 A | 3/2000 | Ponticos | |
| 6,049,386 A | 4/2000 | Stringer et al. | |
| 6,053,409 A | 4/2000 | Brobst et al. | |
| 6,064,759 A | 5/2000 | Buckley et al. | |
| 6,067,110 A | 5/2000 | Nonaka et al. | |
| 6,069,696 A | 5/2000 | McQueen et al. | |
| 6,115,114 A | 9/2000 | Berg et al. | |
| 6,137,577 A | 10/2000 | Woodworth | |
| 6,177,999 B1 | 1/2001 | Wurz et al. | |
| 6,189,223 B1 | 2/2001 | Haug | |
| 6,232,597 B1 | 5/2001 | Kley | |
| 6,236,403 B1 | 5/2001 | Chaki | |
| 6,246,468 B1 | 6/2001 | Dimsdale | |
| 6,333,749 B1 | 12/2001 | Reinhardt et al. | |
| 6,336,587 B1 | 1/2002 | He et al. | |
| 6,369,401 B1 | 4/2002 | Lee | |
| 6,373,579 B1 | 4/2002 | Ober et al. | |
| 6,429,803 B1 | 8/2002 | Kumar | |
| 6,457,642 B1 | 10/2002 | Good et al. | |
| 6,507,406 B1 | 1/2003 | Yagi et al. | |
| 6,517,004 B2 | 2/2003 | Good et al. | |
| 6,519,550 B1 | 2/2003 | D'Hooge et al. | |
| 6,535,776 B1 | 3/2003 | Tobin et al. | |
| 6,661,521 B1 | 9/2003 | Stern | |
| 6,674,904 B1 | 1/2004 | McQueen | |
| 6,705,526 B1 | 3/2004 | Zhu et al. | |
| 6,773,142 B2 * | 8/2004 | Rekow | G02B 27/09 235/462.35 |
| 6,781,621 B1 | 8/2004 | Gobush et al. | |
| 6,804,269 B2 * | 10/2004 | Lizotte | B23K 26/0608 372/100 |
| 6,824,058 B2 | 11/2004 | Patel et al. | |
| 6,832,725 B2 | 12/2004 | Gardiner et al. | |
| 6,858,857 B2 | 2/2005 | Pease et al. | |
| 6,912,293 B1 | 6/2005 | Korobkin | |
| 6,922,632 B2 | 7/2005 | Foxlin | |
| 6,971,580 B2 | 12/2005 | Zhu et al. | |
| 6,995,762 B1 | 2/2006 | Pavlidis et al. | |
| 7,057,632 B2 * | 6/2006 | Yamawaki | G02B 26/124 347/129 |
| 7,085,409 B2 | 8/2006 | Sawhney et al. | |
| 7,086,162 B2 | 8/2006 | Tyroler | |
| 7,104,453 B1 | 9/2006 | Zhu et al. | |
| 7,128,266 B2 | 10/2006 | Zhu et al. | |
| 7,137,556 B1 | 11/2006 | Bonner et al. | |
| 7,159,783 B2 | 1/2007 | Walczyk et al. | |
| 7,161,688 B1 | 1/2007 | Bonner et al. | |
| 7,205,529 B2 | 4/2007 | Andersen et al. | |
| 7,214,954 B2 | 5/2007 | Schopp | |
| 7,233,682 B2 | 6/2007 | Levine | |
| 7,277,187 B2 | 10/2007 | Smith et al. | |
| 7,307,653 B2 | 12/2007 | Dutta | |
| 7,310,431 B2 | 12/2007 | Gokturk et al. | |
| 7,313,264 B2 | 12/2007 | Crampton | |
| 7,353,137 B2 | 4/2008 | Vock et al. | |
| 7,413,127 B2 | 8/2008 | Ehrhart et al. | |
| 7,509,529 B2 | 3/2009 | Colucci et al. | |
| 7,527,205 B2 | 5/2009 | Zhu | |
| 7,586,049 B2 | 9/2009 | Wurz | |
| 7,602,404 B1 | 10/2009 | Reinhardt et al. | |
| 7,614,563 B1 | 11/2009 | Nunnink et al. | |
| 7,639,722 B1 * | 12/2009 | Paxton | G02B 27/0972 359/831 |
| 7,726,206 B2 | 6/2010 | Terrafranca, Jr. et al. | |
| 7,726,575 B2 | 6/2010 | Wang et al. | |
| 7,780,084 B2 | 8/2010 | Zhang et al. | |
| 7,788,883 B2 | 9/2010 | Buckley et al. | |
| 7,912,320 B1 | 3/2011 | Minor | |

(56) References Cited

U.S. PATENT DOCUMENTS

| | | |
|---|---|---|
| 7,974,025 B2 | 7/2011 | Topliss |
| 8,009,358 B2* | 8/2011 | Zalevsky ............ G02B 27/0927 359/618 |
| 8,027,096 B2 | 9/2011 | Feng et al. |
| 8,028,501 B2 | 10/2011 | Buckley et al. |
| 8,050,461 B2 | 11/2011 | Shpunt et al. |
| 8,055,061 B2 | 11/2011 | Katano |
| 8,061,610 B2 | 11/2011 | Nunnink |
| 8,072,581 B1 | 12/2011 | Breiholz |
| 8,102,395 B2 | 1/2012 | Kondo et al. |
| 8,132,728 B2 | 3/2012 | Dwinell et al. |
| 8,134,717 B2 | 3/2012 | Pangrazio et al. |
| 8,149,224 B1 | 4/2012 | Kuo et al. |
| 8,194,097 B2 | 6/2012 | Xiao et al. |
| 8,201,737 B1 | 6/2012 | Palacios Durazo et al. |
| 8,212,158 B2 | 7/2012 | Wiest |
| 8,212,889 B2 | 7/2012 | Chanas et al. |
| 8,224,133 B2* | 7/2012 | Popovich ............... G02B 27/48 385/10 |
| 8,228,510 B2 | 7/2012 | Pangrazio et al. |
| 8,230,367 B2 | 7/2012 | Bell et al. |
| 8,294,969 B2 | 10/2012 | Plesko |
| 8,301,027 B2* | 10/2012 | Shaw ...................... H01S 5/423 398/118 |
| 8,305,458 B2 | 11/2012 | Hara |
| 8,310,656 B2 | 11/2012 | Zalewski |
| 8,313,380 B2 | 11/2012 | Zalewski et al. |
| 8,317,105 B2 | 11/2012 | Kotlarsky et al. |
| 8,320,621 B2* | 11/2012 | McEldowney ........ G03B 17/54 356/5.01 |
| 8,322,622 B2 | 12/2012 | Liu |
| 8,339,462 B2 | 12/2012 | Stec et al. |
| 8,350,959 B2 | 1/2013 | Topliss et al. |
| 8,351,670 B2 | 1/2013 | Ijiri et al. |
| 8,366,005 B2 | 2/2013 | Kotlarsky et al. |
| 8,368,762 B1 | 2/2013 | Chen et al. |
| 8,371,507 B2 | 2/2013 | Haggerty et al. |
| 8,374,498 B2 | 2/2013 | Pastore |
| 8,376,233 B2 | 2/2013 | Van Horn et al. |
| 8,381,976 B2 | 2/2013 | Mohideen et al. |
| 8,381,979 B2 | 2/2013 | Franz |
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,437,539 B2 | 5/2013 | Komatsu et al. |
| 8,441,749 B2 | 5/2013 | Brown et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,463,079 B2 | 6/2013 | Ackley et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,570,343 B2 | 10/2013 | Halstead |
| 8,571,307 B2 | 10/2013 | Li et al. |
| 8,576,390 B1 | 11/2013 | Nunnink |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,594,425 B2 | 11/2013 | Gurman et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,763,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,792,688 B2 | 7/2014 | Unsworth |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |

(56) References Cited

U.S. PATENT DOCUMENTS

| | | | |
|---|---|---|---|
| 8,807,432 B2 | 8/2014 | Van Horn et al. | |
| 8,810,779 B1 | 8/2014 | Hilde | |
| 8,820,630 B2 | 9/2014 | Qu et al. | |
| 8,822,806 B2 | 9/2014 | Cockerell et al. | |
| 8,822,848 B2 | 9/2014 | Meagher | |
| 8,824,692 B2 | 9/2014 | Sheerin et al. | |
| 8,824,696 B2 | 9/2014 | Braho | |
| 8,842,849 B2 | 9/2014 | Wahl et al. | |
| 8,844,822 B2 | 9/2014 | Kotlarsky et al. | |
| 8,844,823 B2 | 9/2014 | Fritz et al. | |
| 8,849,019 B2 | 9/2014 | Li et al. | |
| D716,285 S | 10/2014 | Chaney et al. | |
| 8,851,383 B2 | 10/2014 | Yeakley et al. | |
| 8,854,633 B2 | 10/2014 | Laffargue | |
| 8,866,963 B2 | 10/2014 | Grunow et al. | |
| 8,868,421 B2 | 10/2014 | Braho et al. | |
| 8,868,519 B2 | 10/2014 | Maloy et al. | |
| 8,868,802 B2 | 10/2014 | Barten | |
| 8,868,803 B2 | 10/2014 | Caballero | |
| 8,870,074 B1 | 10/2014 | Gannon | |
| 8,879,639 B2 | 11/2014 | Sauerwein | |
| 8,880,426 B2 | 11/2014 | Smith | |
| 8,881,983 B2 | 11/2014 | Havens et al. | |
| 8,881,987 B2 | 11/2014 | Wang | |
| 8,897,596 B1 | 11/2014 | Passmore et al. | |
| 8,903,172 B2 | 12/2014 | Smith | |
| 8,908,277 B2 * | 12/2014 | Pesach | G01B 11/25 359/619 |
| 8,908,995 B2 | 12/2014 | Benos et al. | |
| 8,910,870 B2 | 12/2014 | Li et al. | |
| 8,910,875 B2 | 12/2014 | Ren et al. | |
| 8,914,290 B2 | 12/2014 | Hendrickson et al. | |
| 8,914,788 B2 | 12/2014 | Pettinelli et al. | |
| 8,915,439 B2 | 12/2014 | Feng et al. | |
| 8,915,444 B2 | 12/2014 | Havens et al. | |
| 8,916,789 B2 | 12/2014 | Woodburn | |
| 8,918,250 B2 | 12/2014 | Hollifield | |
| 8,918,564 B2 | 12/2014 | Caballero | |
| 8,925,818 B2 | 1/2015 | Kosecki et al. | |
| 8,928,896 B2 | 1/2015 | Kennington et al. | |
| 8,939,374 B2 | 1/2015 | Jovanovski et al. | |
| 8,942,480 B2 | 1/2015 | Ellis | |
| 8,944,313 B2 | 2/2015 | Williams et al. | |
| 8,944,327 B2 | 2/2015 | Meier et al. | |
| 8,944,332 B2 | 2/2015 | Harding et al. | |
| 8,950,678 B2 | 2/2015 | Germaine et al. | |
| D723,560 S | 3/2015 | Zhou et al. | |
| 8,967,468 B2 | 3/2015 | Gomez et al. | |
| 8,971,346 B2 | 3/2015 | Sevier | |
| 8,976,030 B2 | 3/2015 | Cunningham et al. | |
| 8,976,368 B2 | 3/2015 | Akel et al. | |
| 8,978,981 B2 | 3/2015 | Guan | |
| 8,978,983 B2 | 3/2015 | Bremer et al. | |
| 8,978,984 B2 | 3/2015 | Hennick et al. | |
| 8,985,456 B2 | 3/2015 | Zhu et al. | |
| 8,985,457 B2 | 3/2015 | Soule et al. | |
| 8,985,459 B2 | 3/2015 | Kearney et al. | |
| 8,985,461 B2 | 3/2015 | Gelay et al. | |
| 8,988,578 B2 | 3/2015 | Showering | |
| 8,988,590 B2 | 3/2015 | Gillet et al. | |
| 8,991,704 B2 | 3/2015 | Hopper et al. | |
| 8,993,974 B2 * | 3/2015 | Goodwin | G01J 1/42 250/370.01 |
| 8,996,194 B2 | 3/2015 | Davis et al. | |
| 8,996,384 B2 | 3/2015 | Funyak et al. | |
| 8,998,091 B2 | 4/2015 | Edmonds et al. | |
| 9,002,641 B2 | 4/2015 | Showering | |
| 9,007,368 B2 | 4/2015 | Laffargue et al. | |
| 9,010,641 B2 | 4/2015 | Qu et al. | |
| 9,014,441 B2 | 4/2015 | Truyen et al. | |
| 9,015,513 B2 | 4/2015 | Murawski et al. | |
| 9,016,576 B2 | 4/2015 | Brady et al. | |
| D730,357 S | 5/2015 | Fitch et al. | |
| 9,022,288 B2 | 5/2015 | Nahill et al. | |
| 9,030,964 B2 | 5/2015 | Essinger et al. | |
| 9,033,240 B2 | 5/2015 | Smith et al. | |
| 9,033,242 B2 | 5/2015 | Gillet et al. | |
| 9,036,054 B2 | 5/2015 | Koziol et al. | |
| 9,037,344 B2 | 5/2015 | Chamberlin | |
| 9,038,911 B2 | 5/2015 | Xian et al. | |
| 9,038,915 B2 | 5/2015 | Smith | |
| D730,901 S | 6/2015 | Oberpriller et al. | |
| D730,902 S | 6/2015 | Fitch et al. | |
| 9,047,098 B2 | 6/2015 | Barten | |
| 9,047,359 B2 | 6/2015 | Caballero et al. | |
| 9,047,420 B2 | 6/2015 | Caballero | |
| 9,047,525 B2 | 6/2015 | Barber | |
| 9,047,531 B2 | 6/2015 | Showering et al. | |
| 9,049,640 B2 | 6/2015 | Wang et al. | |
| 9,053,055 B2 | 6/2015 | Caballero | |
| 9,053,378 B1 | 6/2015 | Hou et al. | |
| 9,053,380 B2 | 6/2015 | Xian et al. | |
| 9,057,641 B2 | 6/2015 | Amundsen et al. | |
| 9,058,526 B2 | 6/2015 | Powilleit | |
| 9,061,527 B2 | 6/2015 | Tobin et al. | |
| 9,064,165 B2 | 6/2015 | Havens et al. | |
| 9,064,167 B2 | 6/2015 | Xian et al. | |
| 9,064,168 B2 | 6/2015 | Todeschini et al. | |
| 9,064,254 B2 | 6/2015 | Todeschini et al. | |
| 9,066,032 B2 | 6/2015 | Wang | |
| 9,066,087 B2 * | 6/2015 | Shpunt | G01B 11/25 |
| 9,070,032 B2 | 6/2015 | Corcoran | |
| D734,339 S | 7/2015 | Zhou et al. | |
| D734,751 S | 7/2015 | Oberpriller et al. | |
| 9,076,459 B2 | 7/2015 | Braho et al. | |
| 9,079,423 B2 | 7/2015 | Bouverie et al. | |
| 9,080,856 B2 | 7/2015 | Laffargue | |
| 9,082,023 B2 | 7/2015 | Feng et al. | |
| 9,082,195 B2 | 7/2015 | Holeva et al. | |
| 9,084,032 B2 | 7/2015 | Rautiola et al. | |
| 9,087,250 B2 | 7/2015 | Coyle | |
| 9,092,681 B2 | 7/2015 | Havens et al. | |
| 9,092,682 B2 | 7/2015 | Wilz et al. | |
| 9,092,683 B2 | 7/2015 | Koziol et al. | |
| 9,093,141 B2 | 7/2015 | Liu | |
| 9,098,763 B2 | 8/2015 | Lu et al. | |
| 9,104,929 B2 | 8/2015 | Todeschini | |
| 9,104,934 B2 | 8/2015 | Li et al. | |
| 9,107,484 B2 | 8/2015 | Chaney | |
| 9,111,159 B2 | 8/2015 | Liu et al. | |
| 9,111,166 B2 | 8/2015 | Cunningham | |
| 9,135,483 B2 | 9/2015 | Liu et al. | |
| 9,137,009 B1 | 9/2015 | Gardiner | |
| 9,141,839 B2 | 9/2015 | Xian et al. | |
| 9,142,035 B1 | 9/2015 | Rotman et al. | |
| 9,147,096 B2 | 9/2015 | Wang | |
| 9,148,474 B2 | 9/2015 | Skvoretz | |
| 9,158,000 B2 | 10/2015 | Sauerwein | |
| 9,158,340 B2 | 10/2015 | Reed et al. | |
| 9,158,953 B2 | 10/2015 | Gillet et al. | |
| 9,159,059 B2 | 10/2015 | Daddabbo et al. | |
| 9,165,174 B2 | 10/2015 | Huck | |
| 9,171,278 B1 | 10/2015 | Kong et al. | |
| 9,171,543 B2 | 10/2015 | Emerick et al. | |
| 9,183,425 B2 | 11/2015 | Wang | |
| 9,189,669 B2 | 11/2015 | Zhu et al. | |
| 9,195,844 B2 | 11/2015 | Todeschini et al. | |
| 9,202,458 B2 | 12/2015 | Braho et al. | |
| 9,208,366 B2 | 12/2015 | Liu | |
| 9,208,367 B2 | 12/2015 | Wang | |
| 9,219,836 B2 | 12/2015 | Bouverie et al. | |
| 9,224,022 B2 | 12/2015 | Ackley et al. | |
| 9,224,024 B2 | 12/2015 | Bremer et al. | |
| 9,224,027 B2 | 12/2015 | Van Horn et al. | |
| D747,321 S | 1/2016 | London et al. | |
| 9,230,140 B1 | 1/2016 | Ackley | |
| 9,233,470 B1 | 1/2016 | Bradski et al. | |
| 9,235,553 B2 | 1/2016 | Fitch et al. | |
| 9,235,899 B1 | 1/2016 | Kirmani et al. | |
| 9,239,950 B2 | 1/2016 | Fletcher | |
| 9,245,492 B2 | 1/2016 | Ackley et al. | |
| 9,443,123 B2 | 1/2016 | Hejl | |
| 9,248,640 B2 | 2/2016 | Heng | |
| 9,250,652 B2 | 2/2016 | London et al. | |

(56) References Cited

U.S. PATENT DOCUMENTS

| | | | |
|---|---|---|---|
| 9,250,712 B1 | 2/2016 | Todeschini |
| 9,251,411 B2 | 2/2016 | Todeschini |
| 9,258,033 B2 | 2/2016 | Showering |
| 9,262,633 B1 | 2/2016 | Todeschini et al. |
| 9,262,660 B2 | 2/2016 | Lu et al. |
| 9,262,662 B2 | 2/2016 | Chen |
| 9,269,036 B2 | 2/2016 | Bremer |
| 9,270,782 B2 | 2/2016 | Hala et al. |
| 9,273,846 B1 * | 3/2016 | Rossi ................... G02B 3/005 |
| 9,274,812 B2 | 3/2016 | Doren et al. |
| 9,275,388 B2 | 3/2016 | Havens et al. |
| 9,277,668 B2 | 3/2016 | Feng et al. |
| 9,280,693 B2 | 3/2016 | Feng et al. |
| 9,286,496 B2 | 3/2016 | Smith |
| 9,297,900 B2 | 3/2016 | Jiang |
| 9,298,964 B2 | 3/2016 | Li et al. |
| 9,299,013 B1 | 3/2016 | Curlander et al. |
| 9,301,427 B2 | 3/2016 | Feng et al. |
| 9,304,376 B2 | 4/2016 | Anderson |
| 9,310,609 B2 | 4/2016 | Rueblinger et al. |
| 9,313,377 B2 | 4/2016 | Todeschini et al. |
| 9,317,037 B2 | 4/2016 | Byford et al. |
| D757,009 S | 5/2016 | Oberpriller et al. |
| 9,342,723 B2 | 5/2016 | Liu et al. |
| 9,342,724 B2 | 5/2016 | McCloskey |
| 9,361,882 B2 | 6/2016 | Ressler et al. |
| 9,365,381 B2 | 6/2016 | Colonel et al. |
| 9,366,861 B1 * | 6/2016 | Johnson ............... G02B 26/125 |
| 9,373,018 B2 | 6/2016 | Colavito et al. |
| 9,375,945 B1 | 6/2016 | Bowles |
| 9,378,403 B2 | 6/2016 | Wang et al. |
| D760,719 S | 7/2016 | Zhou et al. |
| 9,360,304 B2 | 7/2016 | Chang et al. |
| 9,383,848 B2 | 7/2016 | Daghigh |
| 9,384,374 B2 | 7/2016 | Bianconi |
| 9,390,596 B1 | 7/2016 | Todeschini |
| 9,399,557 B1 | 7/2016 | Mishra et al. |
| D762,604 S | 8/2016 | Fitch et al. |
| 9,411,386 B2 | 8/2016 | Sauerwein |
| 9,412,242 B2 | 8/2016 | Van Horn et al. |
| 9,418,269 B2 | 8/2016 | Havens et al. |
| 9,418,270 B2 | 8/2016 | Van Volkinburg et al. |
| 9,423,318 B2 | 8/2016 | Lui et al. |
| 9,424,749 B1 | 8/2016 | Reed et al. |
| D766,244 S | 9/2016 | Zhou et al. |
| 9,443,222 B2 | 9/2016 | Singel et al. |
| 9,454,689 B2 | 9/2016 | McCloskey et al. |
| 9,464,885 B2 | 10/2016 | Lloyd et al. |
| 9,465,967 B2 | 10/2016 | Xian et al. |
| 9,470,511 B2 | 10/2016 | Maynard et al. |
| 9,478,113 B2 | 10/2016 | Xie et al. |
| 9,478,983 B2 | 10/2016 | Kather et al. |
| D771,631 S | 11/2016 | Fitch et al. |
| 9,481,186 B2 | 11/2016 | Bouverie et al. |
| 9,486,921 B1 | 11/2016 | Straszheim et al. |
| 9,488,986 B1 | 11/2016 | Solanki |
| 9,489,782 B2 | 11/2016 | Payne et al. |
| 9,490,540 B1 | 11/2016 | Davies et al. |
| 9,491,729 B2 | 11/2016 | Rautiola et al. |
| 9,497,092 B2 | 11/2016 | Gomez et al. |
| 9,507,974 B1 | 11/2016 | Todeschini |
| 9,519,814 B2 | 12/2016 | Cudzilo |
| 9,521,331 B2 | 12/2016 | Bessettes et al. |
| 9,530,038 B2 | 12/2016 | Xian et al. |
| D777,166 S | 1/2017 | Bidwell et al. |
| 9,558,386 B2 | 1/2017 | Yeakley |
| 9,572,901 B2 | 2/2017 | Todeschini |
| 9,606,581 B1 | 3/2017 | Howe et al. |
| D783,601 S | 4/2017 | Schulte et al. |
| 9,646,189 B2 | 5/2017 | Lu et al. |
| D785,617 S | 5/2017 | Bidwell et al. |
| D785,636 S | 5/2017 | Oberpriller et al. |
| 9,646,191 B2 | 5/2017 | Unemyr et al. |
| 9,652,648 B2 | 5/2017 | Ackley et al. |
| 9,652,653 B2 | 5/2017 | Todeschini et al. |
| 9,656,487 B2 | 5/2017 | Ho et al. |
| 9,659,198 B2 | 5/2017 | Giordano et al. |
| D790,505 S | 6/2017 | Vargo et al. |
| D790,546 S | 6/2017 | Zhou et al. |
| 9,680,282 B2 | 6/2017 | Hanenburg |
| 9,697,401 B2 | 7/2017 | Feng et al. |
| 9,701,140 B1 | 7/2017 | Alaganchetty et al. |
| 9,709,387 B2 | 7/2017 | Fujita et al. |
| 9,736,459 B2 * | 8/2017 | Mor ................... G02B 27/0983 |
| 9,741,136 B2 | 8/2017 | Holz |
| 9,828,223 B2 | 11/2017 | Svensson et al. |
| 2001/0027995 A1 | 10/2001 | Patel et al. |
| 2001/0032879 A1 | 10/2001 | He et al. |
| 2002/0036765 A1 | 3/2002 | McCaffrey |
| 2002/0054289 A1 | 5/2002 | Thibault et al. |
| 2002/0067855 A1 | 6/2002 | Chiu et al. |
| 2002/0105639 A1 | 8/2002 | Roelke |
| 2002/0109835 A1 | 8/2002 | Goetz |
| 2002/0113946 A1 | 8/2002 | Kitaguchi et al. |
| 2002/0118874 A1 | 8/2002 | Chung et al. |
| 2002/0158873 A1 | 10/2002 | Williamson |
| 2002/0167677 A1 | 11/2002 | Okada et al. |
| 2002/0179708 A1 | 12/2002 | Zhu et al. |
| 2002/0186897 A1 | 12/2002 | Kim et al. |
| 2002/0196534 A1 * | 12/2002 | Lizotte ............... B23K 26/0608 359/362 |
| 2003/0038179 A1 * | 2/2003 | Tsikos ................... G02B 26/10 235/454 |
| 2003/0053513 A1 | 3/2003 | Vatan et al. |
| 2003/0063086 A1 | 4/2003 | Baumberg |
| 2003/0078755 A1 | 4/2003 | Leutz et al. |
| 2003/0091227 A1 | 5/2003 | Chang et al. |
| 2003/0156756 A1 | 8/2003 | Gokturk et al. |
| 2003/0163287 A1 | 8/2003 | Vock et al. |
| 2003/0197138 A1 | 10/2003 | Pease et al. |
| 2003/0225712 A1 | 12/2003 | Cooper et al. |
| 2003/0235331 A1 | 12/2003 | Kawaike et al. |
| 2004/0008259 A1 | 1/2004 | Gokturk et al. |
| 2004/0019274 A1 | 1/2004 | Galloway et al. |
| 2004/0024754 A1 | 2/2004 | Mane et al. |
| 2004/0066329 A1 | 4/2004 | Zeitfuss et al. |
| 2004/0073359 A1 | 4/2004 | Ichijo et al. |
| 2004/0083025 A1 | 4/2004 | Yamanouchi et al. |
| 2004/0089482 A1 | 5/2004 | Ramsden et al. |
| 2004/0098146 A1 | 5/2004 | Katae et al. |
| 2004/0105580 A1 | 6/2004 | Hager et al. |
| 2004/0118928 A1 * | 6/2004 | Patel ................... G06K 7/0004 235/472.01 |
| 2004/0122779 A1 | 6/2004 | Stickler et al. |
| 2004/0132297 A1 | 7/2004 | Baba et al. |
| 2004/0155975 A1 | 8/2004 | Hart et al. |
| 2004/0165090 A1 | 8/2004 | Ning |
| 2004/0184041 A1 | 9/2004 | Schopp |
| 2004/0211836 A1 | 10/2004 | Patel et al. |
| 2004/0214623 A1 | 10/2004 | Takahashi et al. |
| 2004/0233461 A1 | 11/2004 | Armstrong et al. |
| 2004/0258353 A1 * | 12/2004 | Gluckstad ............ G02B 6/02347 385/28 |
| 2005/0006477 A1 | 1/2005 | Patel |
| 2005/0117215 A1 | 6/2005 | Lange |
| 2005/0128193 A1 | 6/2005 | Popescu et al. |
| 2005/0128196 A1 | 6/2005 | Popescu et al. |
| 2005/0168488 A1 | 8/2005 | Montague |
| 2005/0211782 A1 | 9/2005 | Martin |
| 2005/0240317 A1 | 10/2005 | Kienzle-Lietl |
| 2005/0257748 A1 | 11/2005 | Kriesel et al. |
| 2005/0264867 A1 | 12/2005 | Cho et al. |
| 2006/0047704 A1 | 3/2006 | Gopalakrishnan |
| 2006/0078226 A1 | 4/2006 | Zhou |
| 2006/0108266 A1 | 5/2006 | Bowers et al. |
| 2006/0109105 A1 | 5/2006 | Varner et al. |
| 2006/0112023 A1 | 5/2006 | Horhann |
| 2006/0151604 A1 | 7/2006 | Zhu et al. |
| 2006/0159307 A1 | 7/2006 | Anderson et al. |
| 2006/0159344 A1 | 7/2006 | Shao et al. |
| 2006/0213999 A1 | 9/2006 | Wang et al. |
| 2006/0230640 A1 | 10/2006 | Chen |
| 2006/0232681 A1 | 10/2006 | Okada |
| 2006/0255150 A1 | 11/2006 | Longacre |

(56) References Cited

U.S. PATENT DOCUMENTS

| | | |
|---|---|---|
| 2006/0269165 A1 | 11/2006 | Viswanathan |
| 2006/0276709 A1 | 12/2006 | Khamene et al. |
| 2006/0291719 A1 | 12/2006 | Ikeda et al. |
| 2007/0003154 A1 | 1/2007 | Sun et al. |
| 2007/0025612 A1 | 2/2007 | Iwasaki et al. |
| 2007/0031064 A1 | 2/2007 | Zhao et al. |
| 2007/0063048 A1 | 3/2007 | Havens et al. |
| 2007/0116357 A1 | 5/2007 | Dewaele |
| 2007/0127022 A1 | 6/2007 | Cohen |
| 2007/0143082 A1 | 6/2007 | Degnan |
| 2007/0153293 A1* | 7/2007 | Gruhlke ............... G06F 3/0317 356/511 |
| 2007/0165013 A1* | 7/2007 | Goulanian ............ G09G 3/003 345/204 |
| 2007/0171220 A1 | 7/2007 | Kriveshko |
| 2007/0177011 A1 | 8/2007 | Lewin et al. |
| 2007/0181685 A1 | 8/2007 | Zhu et al. |
| 2007/0237356 A1 | 10/2007 | Dwinell et al. |
| 2007/0291031 A1 | 12/2007 | Konev et al. |
| 2007/0299338 A1 | 12/2007 | Stevick et al. |
| 2008/0013793 A1 | 1/2008 | Hillis et al. |
| 2008/0035390 A1 | 2/2008 | Wurz |
| 2008/0047760 A1 | 2/2008 | Georgitsis |
| 2008/0050042 A1 | 2/2008 | Zhang et al. |
| 2008/0054062 A1 | 3/2008 | Gunning et al. |
| 2008/0056536 A1 | 3/2008 | Hildreth et al. |
| 2008/0062164 A1 | 3/2008 | Bassi et al. |
| 2008/0065509 A1 | 3/2008 | Williams |
| 2008/0077265 A1 | 3/2008 | Boyden |
| 2008/0079955 A1 | 4/2008 | Storm |
| 2008/0156619 A1 | 7/2008 | Patel et al. |
| 2008/0164074 A1 | 7/2008 | Wurz |
| 2008/0204476 A1 | 8/2008 | Montague |
| 2008/0212168 A1 | 9/2008 | Olmstead et al. |
| 2008/0247635 A1 | 10/2008 | Davis et al. |
| 2008/0273191 A1 | 11/2008 | Kim et al. |
| 2008/0273210 A1 | 11/2008 | Hilde |
| 2008/0278790 A1 | 11/2008 | Boesser et al. |
| 2009/0038182 A1 | 2/2009 | Lans et al. |
| 2009/0046296 A1* | 2/2009 | Kilpatrick ............. G01H 9/004 356/484 |
| 2009/0059004 A1 | 3/2009 | Bochicchio |
| 2009/0081008 A1 | 3/2009 | Somin et al. |
| 2009/0095047 A1 | 4/2009 | Patel et al. |
| 2009/0114818 A1* | 5/2009 | Casares ................ H01J 37/045 250/307 |
| 2009/0134221 A1 | 5/2009 | Zhu et al. |
| 2009/0161090 A1* | 6/2009 | Campbell ............ A61B 3/0091 356/3 |
| 2009/0189858 A1* | 7/2009 | Lev ........................ G06F 3/017 345/158 |
| 2009/0195790 A1 | 8/2009 | Zhu et al. |
| 2009/0225333 A1 | 9/2009 | Bendall et al. |
| 2009/0237411 A1 | 9/2009 | Gossweiler et al. |
| 2009/0268023 A1 | 10/2009 | Hsieh |
| 2009/0272724 A1 | 11/2009 | Gubler |
| 2009/0273770 A1 | 11/2009 | Bauhahn et al. |
| 2009/0313948 A1 | 12/2009 | Buckley et al. |
| 2009/0318815 A1 | 12/2009 | Barnes et al. |
| 2009/0323084 A1 | 12/2009 | Dunn et al. |
| 2009/0323121 A1 | 12/2009 | Valkenburg |
| 2010/0035637 A1 | 2/2010 | Varanasi et al. |
| 2010/0060604 A1 | 3/2010 | Zwart et al. |
| 2010/0091104 A1 | 4/2010 | Sprigle |
| 2010/0113153 A1 | 5/2010 | Yen et al. |
| 2010/0118200 A1 | 5/2010 | Gelman et al. |
| 2010/0128109 A1 | 5/2010 | Banks |
| 2010/0161170 A1 | 6/2010 | Siris |
| 2010/0171740 A1 | 7/2010 | Andersen et al. |
| 2010/0172567 A1 | 7/2010 | Prokoski |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2010/0202702 A1 | 8/2010 | Benos et al. |
| 2010/0208039 A1 | 8/2010 | Stettner |
| 2010/0211355 A1 | 8/2010 | Horst et al. |
| 2010/0217678 A1 | 8/2010 | Goncalves |
| 2010/0220849 A1 | 9/2010 | Colbert et al. |
| 2010/0220894 A1 | 9/2010 | Ackley et al. |
| 2010/0223276 A1 | 9/2010 | Al-Shameri et al. |
| 2010/0245850 A1 | 9/2010 | Lee et al. |
| 2010/0254611 A1 | 10/2010 | Amz |
| 2010/0274728 A1 | 10/2010 | Kugelman |
| 2010/0303336 A1 | 12/2010 | Abraham |
| 2010/0315413 A1 | 12/2010 | Izadi et al. |
| 2010/0321482 A1 | 12/2010 | Cleveland |
| 2011/0019155 A1 | 1/2011 | Daniel et al. |
| 2011/0040192 A1 | 2/2011 | Brenner et al. |
| 2011/0040407 A1 | 2/2011 | Lim |
| 2011/0043609 A1 | 2/2011 | Choi et al. |
| 2011/0075936 A1 | 3/2011 | Deaver |
| 2011/0081044 A1 | 4/2011 | Peeper |
| 2011/0099474 A1 | 4/2011 | Grossman et al. |
| 2011/0169999 A1 | 7/2011 | Grunow et al. |
| 2011/0180695 A1* | 7/2011 | Li ........................ G02B 3/0018 250/216 |
| 2011/0188054 A1* | 8/2011 | Petronius ............. B23P 11/00 356/610 |
| 2011/0188741 A1 | 8/2011 | Sones et al. |
| 2011/0202554 A1 | 8/2011 | Powilleit et al. |
| 2011/0234389 A1 | 9/2011 | Mellin |
| 2011/0235854 A1 | 9/2011 | Berger et al. |
| 2011/0243432 A1 | 10/2011 | Hirsch et al. |
| 2011/0249864 A1 | 10/2011 | Venkatesan et al. |
| 2011/0254840 A1 | 10/2011 | Halstead |
| 2011/0260965 A1 | 10/2011 | Kim et al. |
| 2011/0279916 A1 | 11/2011 | Brown |
| 2011/0286007 A1 | 11/2011 | Pangrazio et al. |
| 2011/0286628 A1 | 11/2011 | Goncalves et al. |
| 2011/0288818 A1 | 11/2011 | Thierman |
| 2011/0297590 A1 | 12/2011 | Ackley et al. |
| 2011/0301994 A1 | 12/2011 | Tieman |
| 2011/0303748 A1 | 12/2011 | Lemma et al. |
| 2011/0310227 A1 | 12/2011 | Konertz et al. |
| 2011/0310256 A1 | 12/2011 | Shishido |
| 2012/0014572 A1 | 1/2012 | Wong et al. |
| 2012/0024952 A1 | 2/2012 | Chen |
| 2012/0056982 A1 | 3/2012 | Katz et al. |
| 2012/0057345 A1* | 3/2012 | Kuchibhotla ...... G02B 27/0961 362/237 |
| 2012/0067955 A1 | 3/2012 | Rowe |
| 2012/0074227 A1 | 3/2012 | Ferren et al. |
| 2012/0081714 A1 | 4/2012 | Pangrazio et al. |
| 2012/0082383 A1 | 4/2012 | Kruglick |
| 2012/0111946 A1 | 5/2012 | Golant |
| 2012/0113223 A1 | 5/2012 | Hilliges et al. |
| 2012/0126000 A1 | 5/2012 | Kunzig et al. |
| 2012/0140300 A1 | 6/2012 | Freeman |
| 2012/0168509 A1 | 7/2012 | Nunnink et al. |
| 2012/0168512 A1 | 7/2012 | Kotlarsky et al. |
| 2012/0179665 A1 | 7/2012 | Baarman et al. |
| 2012/0185094 A1 | 7/2012 | Rosenstein et al. |
| 2012/0190386 A1 | 7/2012 | Anderson |
| 2012/0193423 A1 | 8/2012 | Samek |
| 2012/0197464 A1 | 8/2012 | Wang et al. |
| 2012/0203647 A1 | 8/2012 | Smith |
| 2012/0218436 A1 | 9/2012 | Rodriguez et al. |
| 2012/0223141 A1 | 9/2012 | Good et al. |
| 2012/0224026 A1 | 9/2012 | Bayer et al. |
| 2012/0224060 A1 | 9/2012 | Gurevich et al. |
| 2012/0236212 A1* | 9/2012 | Itoh ........................ G02B 3/005 348/744 |
| 2012/0236288 A1* | 9/2012 | Stanley ............... G01B 11/2513 356/4.01 |
| 2012/0242852 A1 | 9/2012 | Hayward et al. |
| 2012/0113250 A1 | 10/2012 | Farlotti et al. |
| 2012/0256901 A1 | 10/2012 | Bendall |
| 2012/0261474 A1 | 10/2012 | Kawashime et al. |
| 2012/0262558 A1 | 10/2012 | Boger et al. |
| 2012/0280908 A1 | 11/2012 | Rhoads et al. |
| 2012/0282905 A1 | 11/2012 | Owen |
| 2012/0282911 A1 | 11/2012 | Davis et al. |

(56) References Cited

U.S. PATENT DOCUMENTS

| | | |
|---|---|---|
| 2012/0284012 A1 | 11/2012 | Rodriguez et al. |
| 2012/0284122 A1 | 11/2012 | Brandis |
| 2012/0284339 A1 | 11/2012 | Rodriguez |
| 2012/0284593 A1 | 11/2012 | Rodriguez |
| 2012/0293610 A1 | 11/2012 | Doepke et al. |
| 2012/0293625 A1 | 11/2012 | Schneider et al. |
| 2012/0294478 A1 | 11/2012 | Publicover et al. |
| 2012/0294549 A1 | 11/2012 | Doepke |
| 2012/0299961 A1 | 11/2012 | Ramkumar et al. |
| 2012/0300991 A1 | 11/2012 | Mikio |
| 2012/0313848 A1 | 12/2012 | Galor et al. |
| 2012/0314030 A1 | 12/2012 | Datta |
| 2012/0314058 A1* | 12/2012 | Bendall .................. G01C 3/08 348/135 |
| 2012/0314258 A1 | 12/2012 | Moriya |
| 2012/0316820 A1 | 12/2012 | Nakazato et al. |
| 2013/0019278 A1 | 1/2013 | Sun et al. |
| 2013/0038881 A1* | 2/2013 | Pesach .................. G01B 11/25 356/610 |
| 2013/0038941 A1* | 2/2013 | Pesach .................. G01B 11/25 359/619 |
| 2013/0043312 A1 | 2/2013 | Van Horn |
| 2013/0050426 A1 | 2/2013 | Sarmast et al. |
| 2013/0075168 A1 | 3/2013 | Amundsen et al. |
| 2013/0076857 A1* | 3/2013 | Kurashige .............. G01B 11/25 348/40 |
| 2013/0093895 A1 | 4/2013 | Palmer et al. |
| 2013/0094069 A1 | 4/2013 | Lee et al. |
| 2013/0101158 A1 | 4/2013 | Lloyd et al. |
| 2013/0156267 A1 | 6/2013 | Muraoka et al. |
| 2013/0175341 A1 | 7/2013 | Kearney et al. |
| 2013/0175343 A1 | 7/2013 | Good |
| 2013/0200150 A1 | 8/2013 | Reynolds et al. |
| 2013/0201288 A1 | 8/2013 | Billerbaeck et al. |
| 2013/0208164 A1 | 8/2013 | Cazier et al. |
| 2013/0211790 A1 | 8/2013 | Loveland et al. |
| 2013/0222592 A1 | 8/2013 | Gieseke |
| 2013/0223673 A1 | 8/2013 | Davis et al. |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0291998 A1 | 11/2013 | Konnerth |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308013 A1 | 11/2013 | Li et al. |
| 2013/0308625 A1 | 11/2013 | Park et al. |
| 2013/0313324 A1 | 11/2013 | Koziol et al. |
| 2013/0317642 A1 | 11/2013 | Asaria |
| 2013/0329012 A1 | 12/2013 | Bartos |
| 2013/0329013 A1 | 12/2013 | Metois et al. |
| 2013/0332524 A1 | 12/2013 | Fiala et al. |
| 2013/0342343 A1 | 12/2013 | Harring et al. |
| 2014/0001258 A1 | 1/2014 | Chan et al. |
| 2014/0001267 A1 | 1/2014 | Giordano et al. |
| 2014/0002828 A1 | 1/2014 | Laffargue et al. |
| 2014/0009586 A1 | 1/2014 | McNamer et al. |
| 2014/0019005 A1 | 1/2014 | Lee et al. |
| 2014/0021259 A1 | 1/2014 | Moed et al. |
| 2014/0025584 A1 | 1/2014 | Liu et al. |
| 2014/0031665 A1 | 1/2014 | Pinto et al. |
| 2014/0100813 A1 | 1/2014 | Showering |
| 2014/0034731 A1 | 2/2014 | Gao et al. |
| 2014/0034734 A1 | 2/2014 | Sauerwein |
| 2014/0039674 A1 | 2/2014 | Motoyama et al. |
| 2014/0039693 A1 | 2/2014 | Havens et al. |
| 2014/0049120 A1 | 2/2014 | Kohtz et al. |
| 2014/0049635 A1* | 2/2014 | Laffargue .............. G01F 25/0084 348/135 |
| 2014/0058612 A1 | 2/2014 | Wong et al. |
| 2014/0061306 A1 | 3/2014 | Wu et al. |
| 2014/0062709 A1 | 3/2014 | Hyer et al. |
| 2014/0063289 A1 | 3/2014 | Hussey et al. |
| 2014/0064624 A1 | 3/2014 | Kim et al. |
| 2014/0066136 A1 | 3/2014 | Sauerwein et al. |
| 2014/0067104 A1 | 3/2014 | Osterhout |
| 2014/0067692 A1 | 3/2014 | Ye et al. |
| 2014/0070005 A1 | 3/2014 | Nahill et al. |
| 2014/0071430 A1 | 3/2014 | Hansen et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078342 A1 | 3/2014 | Li et al. |
| 2014/0079297 A1 | 3/2014 | Tadayon et al. |
| 2014/0091147 A1 | 4/2014 | Evans et al. |
| 2014/0097238 A1 | 4/2014 | Ghazizadeh |
| 2014/0097252 A1* | 4/2014 | He .................. G06K 7/10722 235/462.41 |
| 2014/0098091 A1 | 4/2014 | Hori |
| 2014/0098243 A1 | 4/2014 | Ghazizadeh |
| 2014/0098244 A1 | 4/2014 | Ghazizadeh |
| 2014/0098792 A1 | 4/2014 | Wang et al. |
| 2014/0100774 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104664 A1 | 4/2014 | Lee |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0125577 A1 | 5/2014 | Hoang et al. |
| 2014/0125853 A1 | 5/2014 | Wang |
| 2014/0125999 A1 | 5/2014 | Longacre et al. |
| 2014/0129378 A1 | 5/2014 | Richardson |
| 2014/0131443 A1 | 5/2014 | Smith |
| 2014/0131444 A1 | 5/2014 | Wang |
| 2014/0133379 A1 | 5/2014 | Wang et al. |
| 2014/0135984 A1 | 5/2014 | Hirata |
| 2014/0136208 A1 | 5/2014 | Maltseff et al. |
| 2014/0139654 A1 | 5/2014 | Taskahashi |
| 2014/0140585 A1 | 5/2014 | Wang |
| 2014/0142398 A1 | 5/2014 | Patil et al. |
| 2014/0152882 A1 | 6/2014 | Samek et al. |
| 2014/0152975 A1 | 6/2014 | Ko |
| 2014/0158468 A1 | 6/2014 | Adami |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0168380 A1* | 6/2014 | Heidemann ............ G01B 11/25 348/47 |
| 2014/0168787 A1 | 6/2014 | Wang et al. |
| 2014/0175165 A1 | 6/2014 | Havens et al. |
| 2014/0177931 A1 | 6/2014 | Kocherscheidt et al. |
| 2014/0191913 A1 | 7/2014 | Ge et al. |
| 2014/0192187 A1 | 7/2014 | Atwell et al. |
| 2014/0192551 A1 | 7/2014 | Masaki |
| 2014/0197239 A1 | 7/2014 | Havens et al. |
| 2014/0197304 A1 | 7/2014 | Feng et al. |
| 2014/0201126 A1 | 7/2014 | Zadeh et al. |
| 2014/0204268 A1 | 7/2014 | Grunow et al. |
| 2014/0205150 A1 | 7/2014 | Ogawa |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0225918 A1 | 8/2014 | Mittal et al. |
| 2014/0225985 A1 | 8/2014 | Klusza et al. |
| 2014/0231500 A1 | 8/2014 | Ehrhart et al. |
| 2014/0239071 A1* | 8/2014 | Hennick ............ G06K 7/10732 235/455 |
| 2014/0240454 A1 | 8/2014 | Lee |
| 2014/0247279 A1 | 9/2014 | Nicholas et al. |
| 2014/0247280 A1 | 9/2014 | Nicholas et al. |
| 2014/0247315 A1 | 9/2014 | Marty et al. |
| 2014/0263493 A1 | 9/2014 | Amurgis et al. |

(56) References Cited

U.S. PATENT DOCUMENTS

| | | |
|---|---|---|
| 2014/0263645 A1 | 9/2014 | Smith et al. |
| 2014/0267609 A1 | 9/2014 | Laffargue |
| 2014/0268093 A1 | 9/2014 | Tohme et al. |
| 2014/0270196 A1 | 9/2014 | Braho et al. |
| 2014/0270229 A1 | 9/2014 | Braho |
| 2014/0270361 A1 | 9/2014 | Amma et al. |
| 2014/0278387 A1 | 9/2014 | DiGregorio |
| 2014/0282210 A1 | 9/2014 | Bianconi |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0306833 A1 | 10/2014 | Ricci |
| 2014/0307855 A1 | 10/2014 | Withagen et al. |
| 2014/0313527 A1 | 10/2014 | Askan |
| 2014/0319219 A1 | 10/2014 | Liu et al. |
| 2014/0320408 A1 | 10/2014 | Zagorsek et al. |
| 2014/0320605 A1 | 10/2014 | Johnson |
| 2014/0333775 A1 | 11/2014 | Naikal et al. |
| 2014/0347533 A1 | 11/2014 | Ovsiannikov et al. |
| 2014/0350710 A1 | 11/2014 | Gopalkrishnan et al. |
| 2014/0351317 A1 | 11/2014 | Smith et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2014/0379613 A1 | 12/2014 | Nishitani et al. |
| 2015/0001301 A1 | 1/2015 | Ouyang |
| 2015/0003673 A1 | 1/2015 | Fletcher |
| 2015/0009100 A1 | 1/2015 | Haneda et al. |
| 2015/0009301 A1 | 1/2015 | Ribnick et al. |
| 2015/0009338 A1 | 1/2015 | Laffargue et al. |
| 2015/0014416 A1 | 1/2015 | Kotlarsky et al. |
| 2015/0016712 A1 | 1/2015 | Rhoads et al. |
| 2015/0021397 A1 | 1/2015 | Rueblinger et al. |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0036876 A1 | 2/2015 | Marrion et al. |
| 2015/0039309 A1 | 2/2015 | Braho et al. |
| 2015/0040378 A1 | 2/2015 | Saber et al. |
| 2015/0042791 A1 | 2/2015 | Metois et al. |
| 2015/0049347 A1 | 2/2015 | Laffargue et al. |
| 2015/0051992 A1 | 2/2015 | Smith |
| 2015/0053769 A1 | 2/2015 | Thuries et al. |
| 2015/0062160 A1 | 3/2015 | Sakamoto et al. |
| 2015/0062366 A1 | 3/2015 | Liu et al. |
| 2015/0062369 A1 | 3/2015 | Gehring et al. |
| 2015/0063215 A1 | 3/2015 | Wang |
| 2015/0063676 A1 | 3/2015 | Lloyd et al. |
| 2015/0070158 A1 | 3/2015 | Hayasaka |
| 2015/0070489 A1 | 3/2015 | Hudman et al. |
| 2015/0088522 A1 | 3/2015 | Hendrickson et al. |
| 2015/0096872 A1 | 4/2015 | Woodburn |
| 2015/0100196 A1 | 4/2015 | Hollifield |
| 2015/0115035 A1 | 4/2015 | Meier et al. |
| 2015/0116498 A1 | 4/2015 | Vartiainen et al. |
| 2015/0117749 A1 | 4/2015 | Chen et al. |
| 2015/0127791 A1 | 5/2015 | Kosecki et al. |
| 2015/0128116 A1 | 5/2015 | Chen et al. |
| 2015/0130928 A1 | 5/2015 | Maynard et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0149946 A1 | 5/2015 | Benos et al. |
| 2015/0161429 A1 | 6/2015 | Xian |
| 2015/0163474 A1 | 6/2015 | You |
| 2015/0178900 A1 | 6/2015 | Kim et al. |
| 2015/0182844 A1 | 7/2015 | Jang |
| 2015/0186703 A1 | 7/2015 | Chen et al. |
| 2015/0199957 A1 | 7/2015 | Funyak et al. |
| 2015/0204662 A1 | 7/2015 | Kobayashi et al. |
| 2015/0210199 A1 | 7/2015 | Payne |
| 2015/0213590 A1 | 7/2015 | Brown et al. |
| 2015/0213647 A1 | 7/2015 | Laffargue et al. |
| 2015/0219748 A1 | 8/2015 | Hyatt |
| 2015/0220753 A1 | 8/2015 | Zhu et al. |
| 2015/0229838 A1 | 8/2015 | Hakim et al. |
| 2015/0243030 A1 | 8/2015 | Pfeiffer |
| 2015/0248578 A1 | 9/2015 | Utsumi |
| 2015/0253469 A1* | 9/2015 | Le Gros .............. G02B 3/0006 359/619 |
| 2015/0254485 A1 | 9/2015 | Feng et al. |
| 2015/0260830 A1* | 9/2015 | Ghosh .................... G01S 7/484 250/208.1 |
| 2015/0269403 A1 | 9/2015 | Lei et al. |
| 2015/0201181 A1 | 10/2015 | Herschbach |
| 2015/0276379 A1 | 10/2015 | Ni et al. |
| 2015/0308816 A1 | 10/2015 | Laffargue et al. |
| 2015/0310243 A1 | 10/2015 | Ackley |
| 2015/0310389 A1 | 10/2015 | Crimm et al. |
| 2015/0316368 A1* | 11/2015 | Moench ................. H01S 5/005 348/46 |
| 2015/0325036 A1 | 11/2015 | Lee |
| 2015/0327012 A1 | 11/2015 | Bian et al. |
| 2015/0332075 A1 | 11/2015 | Burch |
| 2015/0332463 A1 | 11/2015 | Galera et al. |
| 2015/0355470 A1* | 12/2015 | Herschbach ........ G02B 27/0977 362/11 |
| 2016/0014251 A1 | 1/2016 | Hejl |
| 2016/0026838 A1* | 1/2016 | Gillet ................... G02B 26/101 235/462.21 |
| 2016/0169665 A1 | 1/2016 | Deschenes et al. |
| 2016/0040982 A1 | 2/2016 | Li et al. |
| 2016/0042241 A1 | 2/2016 | Todeschini |
| 2016/0048725 A1 | 2/2016 | Holz et al. |
| 2016/0057230 A1 | 2/2016 | Todeschini et al. |
| 2016/0070982 A1 | 2/2016 | Li et al. |
| 2016/0062473 A1 | 3/2016 | Bouchat et al. |
| 2016/0063429 A1 | 3/2016 | Varley et al. |
| 2016/0065912 A1 | 3/2016 | Peterson |
| 2016/0088287 A1 | 3/2016 | Sadi et al. |
| 2016/0090283 A1 | 3/2016 | Svensson et al. |
| 2016/0090284 A1 | 3/2016 | Svensson et al. |
| 2016/0092805 A1 | 3/2016 | Geisler et al. |
| 2016/0094016 A1* | 3/2016 | Beach .................... G02B 27/30 359/572 |
| 2016/0101936 A1 | 4/2016 | Chamberlin |
| 2016/0102975 A1* | 4/2016 | McCloskey ............ G01B 21/02 702/97 |
| 2016/0104019 A1 | 4/2016 | Todeschini et al. |
| 2016/0104274 A1 | 4/2016 | Jovanovski et al. |
| 2016/0109219 A1 | 4/2016 | Ackley et al. |
| 2016/0109220 A1 | 4/2016 | Laffargue |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0117627 A1 | 4/2016 | Raj et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0138247 A1 | 5/2016 | Conway et al. |
| 2016/0138248 A1 | 5/2016 | Conway et al. |
| 2016/0138249 A1 | 5/2016 | Svensson et al. |
| 2016/0147408 A1 | 5/2016 | Bevis et al. |
| 2016/0164261 A1* | 6/2016 | Warren ................ H01S 5/18388 348/164 |
| 2016/0171597 A1 | 6/2016 | Todeschini |
| 2016/0171666 A1 | 6/2016 | McCloskey |
| 2016/0171720 A1 | 6/2016 | Todeschini |
| 2016/0171775 A1 | 6/2016 | Todeschini et al. |
| 2016/0171777 A1 | 6/2016 | Todeschini et al. |
| 2016/0174674 A1 | 6/2016 | Oberpriller et al. |
| 2016/0178479 A1 | 6/2016 | Goldsmith |
| 2016/0178685 A1 | 6/2016 | Young et al. |
| 2016/0178707 A1 | 6/2016 | Young et al. |
| 2016/0178915 A1* | 6/2016 | Mor .................... G02B 27/1093 359/573 |
| 2016/0179132 A1 | 6/2016 | Harr et al. |

(56) References Cited

U.S. PATENT DOCUMENTS

| | | |
|---|---|---|
| 2016/0179143 A1 | 6/2016 | Bidwell et al. |
| 2016/0179368 A1 | 6/2016 | Roeder |
| 2016/0179378 A1 | 6/2016 | Kent et al. |
| 2016/0180130 A1 | 6/2016 | Bremer |
| 2016/0180133 A1 | 6/2016 | Oberpriller et al. |
| 2016/0180136 A1 | 6/2016 | Meier et al. |
| 2016/0180594 A1 | 6/2016 | Todeschini |
| 2016/0180663 A1 | 6/2016 | McMahan et al. |
| 2016/0180678 A1 | 6/2016 | Ackley et al. |
| 2016/0180713 A1 | 6/2016 | Bernhardt et al. |
| 2016/0185136 A1 | 6/2016 | Ng et al. |
| 2016/0185291 A1 | 6/2016 | Chamberlin |
| 2016/0186926 A1 | 6/2016 | Oberpriller et al. |
| 2016/0187186 A1 | 6/2016 | Coleman et al. |
| 2016/0187187 A1 | 6/2016 | Coleman et al. |
| 2016/0187210 A1 | 6/2016 | Coleman et al. |
| 2016/0188861 A1 | 6/2016 | Todeschini |
| 2016/0188939 A1 | 6/2016 | Sailors et al. |
| 2016/0188940 A1 | 6/2016 | Lu et al. |
| 2016/0188941 A1 | 6/2016 | Todeschini et al. |
| 2016/0188942 A1 | 6/2016 | Good et al. |
| 2016/0188943 A1 | 6/2016 | Linwood |
| 2016/0188944 A1 | 6/2016 | Wilz et al. |
| 2016/0189076 A1 | 6/2016 | Mellott et al. |
| 2016/0189087 A1 | 6/2016 | Morton et al. |
| 2016/0189088 A1 | 6/2016 | Percorari et al. |
| 2016/0189092 A1 | 6/2016 | George et al. |
| 2016/0189284 A1 | 6/2016 | Mellott et al. |
| 2016/0189288 A1 | 6/2016 | Todeschini |
| 2016/0189366 A1 | 6/2016 | Chamberlin et al. |
| 2016/0189443 A1 | 6/2016 | Smith |
| 2016/0189447 A1 | 6/2016 | Valenzuela |
| 2016/0189489 A1 | 6/2016 | Au et al. |
| 2016/0191684 A1 | 6/2016 | DiPiazza et al. |
| 2016/0191801 A1 | 6/2016 | Sivan |
| 2016/0192051 A1 | 6/2016 | DiPiazza et al. |
| 2016/0125873 A1 | 7/2016 | Braho et al. |
| 2016/0202478 A1* | 7/2016 | Masson ............. G02B 26/0833 353/30 |
| 2016/0202951 A1 | 7/2016 | Pike et al. |
| 2016/0202958 A1 | 7/2016 | Zabel et al. |
| 2016/0202959 A1 | 7/2016 | Doubleday et al. |
| 2016/0203021 A1 | 7/2016 | Pike et al. |
| 2016/0203429 A1 | 7/2016 | Mellott et al. |
| 2016/0203641 A1 | 7/2016 | Bostick et al. |
| 2016/0203797 A1 | 7/2016 | Pike et al. |
| 2016/0203820 A1 | 7/2016 | Zabel et al. |
| 2016/0204623 A1 | 7/2016 | Haggert et al. |
| 2016/0204636 A1 | 7/2016 | Allen et al. |
| 2016/0204638 A1 | 7/2016 | Miraglia et al. |
| 2016/0210780 A1 | 7/2016 | Paulovich et al. |
| 2016/0316190 A1 | 7/2016 | McCloskey et al. |
| 2016/0223474 A1 | 8/2016 | Tang et al. |
| 2016/0227912 A1 | 8/2016 | Oberpriller et al. |
| 2016/0232891 A1 | 8/2016 | Pecorari |
| 2016/0292477 A1 | 10/2016 | Bidwell |
| 2016/0294779 A1 | 10/2016 | Yeakley et al. |
| 2016/0306769 A1 | 10/2016 | Kohtz et al. |
| 2016/0314276 A1 | 10/2016 | Sewell et al. |
| 2016/0314294 A1 | 10/2016 | Kubler et al. |
| 2016/0323310 A1 | 11/2016 | Todeschini et al. |
| 2016/0325677 A1 | 11/2016 | Fitch et al. |
| 2016/0327614 A1 | 11/2016 | Young et al. |
| 2016/0327930 A1 | 11/2016 | Charpentier et al. |
| 2016/0328762 A1 | 11/2016 | Pape |
| 2016/0328854 A1 | 11/2016 | Kimura |
| 2016/0330218 A1 | 11/2016 | Hussey et al. |
| 2016/0343163 A1 | 11/2016 | Venkatesha et al. |
| 2016/0343176 A1 | 11/2016 | Ackley |
| 2016/0364914 A1 | 12/2016 | Todeschini |
| 2016/0370220 A1 | 12/2016 | Ackley et al. |
| 2016/0372282 A1 | 12/2016 | Bandringa |
| 2016/0373847 A1 | 12/2016 | Vargo et al. |
| 2016/0377414 A1 | 12/2016 | Thuries et al. |
| 2016/0377417 A1 | 12/2016 | Jovanovski et al. |
| 2017/0010141 A1 | 1/2017 | Ackley |
| 2017/0010328 A1 | 1/2017 | Mullen et al. |
| 2017/0010780 A1 | 1/2017 | Waldron, Jr. et al. |
| 2017/0016714 A1 | 1/2017 | Laffargue et al. |
| 2017/0018094 A1 | 1/2017 | Todeschini |
| 2017/0046603 A1 | 2/2017 | Lee et al. |
| 2017/0047864 A1 | 2/2017 | Stang et al. |
| 2017/0053146 A1 | 2/2017 | Liu et al. |
| 2017/0053147 A1 | 2/2017 | Geramine et al. |
| 2017/0053647 A1 | 2/2017 | Nichols et al. |
| 2017/0055606 A1 | 3/2017 | Xu et al. |
| 2017/0060316 A1 | 3/2017 | Larson |
| 2017/0061961 A1 | 3/2017 | Nichols et al. |
| 2017/0064634 A1 | 3/2017 | Van Horn et al. |
| 2017/0083730 A1 | 3/2017 | Feng et al. |
| 2017/0091502 A1 | 3/2017 | Furlong et al. |
| 2017/0091706 A1 | 3/2017 | Lloyd et al. |
| 2017/0091741 A1 | 3/2017 | Todeschini |
| 2017/0091904 A1 | 3/2017 | Ventress |
| 2017/0092908 A1 | 3/2017 | Chaney |
| 2017/0094238 A1 | 3/2017 | Germaine et al. |
| 2017/0098947 A1 | 4/2017 | Wolski |
| 2017/0100949 A1 | 4/2017 | Celinder et al. |
| 2017/0103545 A1 | 4/2017 | Holz |
| 2017/0108838 A1 | 4/2017 | Todeschinie et al. |
| 2017/0108895 A1 | 4/2017 | Chamberlin et al. |
| 2017/0115490 A1 | 4/2017 | Hsieh et al. |
| 2017/0115497 A1* | 4/2017 | Chen .................. G06K 9/2036 |
| 2017/0116462 A1 | 4/2017 | Ogasawara |
| 2017/0118355 A1 | 4/2017 | Wong et al. |
| 2017/0121158 A1 | 5/2017 | Wong |
| 2017/0123598 A1 | 5/2017 | Phan et al. |
| 2017/0124369 A1 | 5/2017 | Rueblinger et al. |
| 2017/0124396 A1 | 5/2017 | Todeschini et al. |
| 2017/0124687 A1 | 5/2017 | McCloskey et al. |
| 2017/0126873 A1 | 5/2017 | McGary et al. |
| 2017/0126904 A1 | 5/2017 | d'Armancourt et al. |
| 2017/0132806 A1 | 5/2017 | Balachandreswaran |
| 2017/0139012 A1 | 5/2017 | Smith |
| 2017/0139213 A1* | 5/2017 | Schmidtlin ........ G02B 27/0172 |
| 2017/0140329 A1 | 5/2017 | Bernhardt et al. |
| 2017/0140731 A1 | 5/2017 | Smith |
| 2017/0147847 A1 | 5/2017 | Berggren et al. |
| 2017/0148250 A1 | 5/2017 | Angermayer |
| 2017/0150124 A1 | 5/2017 | Thuries |
| 2017/0018294 A1 | 6/2017 | Hardy et al. |
| 2017/0169198 A1 | 6/2017 | Nichols |
| 2017/0171035 A1 | 6/2017 | Lu et al. |
| 2017/0171703 A1 | 6/2017 | Maheswaranathan |
| 2017/0171803 A1 | 6/2017 | Maheswaranathan |
| 2017/0180359 A1 | 6/2017 | Wolski et al. |
| 2017/0180577 A1 | 6/2017 | Nguon et al. |
| 2017/0181299 A1 | 6/2017 | Shi et al. |
| 2017/0190192 A1 | 7/2017 | Delario et al. |
| 2017/0193432 A1 | 7/2017 | Bernhardt |
| 2017/0193461 A1 | 7/2017 | Jonas et al. |
| 2017/0193727 A1 | 7/2017 | Van Horn et al. |
| 2017/0200108 A1 | 7/2017 | Au et al. |
| 2017/0200275 A1 | 7/2017 | McCloskey et al. |
| 2017/0200296 A1 | 7/2017 | Jones et al. |
| 2017/0309108 A1 | 10/2017 | Sadovsky et al. |
| 2017/0336870 A1 | 11/2017 | Everett et al. |
| 2018/0100733 A1* | 4/2018 | Thuries .................. G01B 11/02 |

FOREIGN PATENT DOCUMENTS

| | | |
|---|---|---|
| DE | 3335760 A1 | 4/1985 |
| DE | 10210813 A1 | 10/2003 |
| DE | 102007037282 A1 | 3/2008 |
| EP | 1111435 A2 | 6/2001 |
| EP | 1443312 A1 | 8/2004 |
| EP | 1112483 B1 | 5/2006 |
| EP | 1232480 B1 | 5/2006 |
| EP | 2013117 A1 | 1/2009 |
| EP | 2216634 A1 | 8/2010 |
| EP | 2286932 A2 | 2/2011 |
| EP | 2372648 A2 | 10/2011 |
| EP | 2381421 A2 | 10/2011 |
| EP | 2533009 A1 | 12/2012 |

(56) References Cited

FOREIGN PATENT DOCUMENTS

| | | |
|---|---|---|
| EP | 2562715 A1 | 2/2013 |
| EP | 2722656 A1 | 4/2014 |
| EP | 2779027 A1 | 9/2014 |
| EP | 2833323 A2 | 2/2015 |
| EP | 2843590 A2 | 3/2015 |
| EP | 2845170 A1 | 3/2015 |
| EP | 2966595 A1 | 1/2016 |
| EP | 3006893 A1 | 3/2016 |
| EP | 3012601 A1 | 3/2016 |
| EP | 3007096 A1 | 4/2016 |
| GB | 2503978 A1 | 1/2014 |
| GB | 2525053 A | 10/2015 |
| GB | 2531928 A | 5/2016 |
| JP | H04129902 A | 4/1992 |
| JP | 200696457 A | 4/2006 |
| JP | 2007084162 A | 4/2007 |
| JP | 2008210276 A | 9/2008 |
| JP | 2014210646 A | 11/2014 |
| JP | 2015174705 A | 10/2015 |
| KR | 20100020115 A | 2/2010 |
| KR | 20110013200 A | 2/2011 |
| KR | 20110117020 A | 10/2011 |
| KR | 20120028109 A | 3/2012 |
| WO | 96/40452 A1 | 12/1996 |
| WO | 0077726 A1 | 12/2000 |
| WO | 0114836 A1 | 3/2001 |
| WO | 2006095110 A1 | 9/2006 |
| WO | 2007015059 A1 | 2/2007 |
| WO | 200712554 A1 | 11/2007 |
| WO | 2011017241 A1 | 2/2011 |
| WO | 2012175731 A1 | 12/2012 |
| WO | 2013021157 A1 | 2/2013 |
| WO | 2013033442 A1 | 3/2013 |
| WO | 2013163789 A1 | 11/2013 |
| WO | 2013166368 A1 | 11/2013 |
| WO | 20130184340 A1 | 12/2013 |
| WO | 2014023697 A1 | 2/2014 |
| WO | 2014102341 A1 | 7/2014 |
| WO | 2014149702 A1 | 9/2014 |
| WO | 2014151746 A1 | 9/2014 |
| WO | 2015006865 A1 | 1/2015 |
| WO | 2016020038 A1 | 2/2016 |
| WO | 2016061699 | 4/2016 |
| WO | 2016061699 A1 | 4/2016 |
| WO | 2016085682 A1 | 6/2016 |

OTHER PUBLICATIONS

Extended European Search report in related EP Application No. 17189496.7 dated Dec. 5, 2017; 9 pages.
Extended European Search report in related EP Application No. 17190323.0 dated Jan. 19, 2018; 6 pages [Only new art cited herein].
Examination Report in related GB Application No. GB1517843.7, dated Jan. 19, 2018, 4 pages [Only new art cited herein].
Examination Report in related EP Application No. 15190315, dated Jan. 26, 2018, 6 pages [Only new art cited herein].
Padzensky, Ron; "Augmera; Gesture Control", Dated Apr. 18, 2015, 15 pages. [Examiner Cited Art in Office Action dated Jan. 20, 2017 in related Application.].
Grabowski, Ralph; "New Commands in AutoCADS 2010: Part 11 Smoothing 3D Mesh Objects" Dated 2011, 6 pages, [Examiner Cited Art in Office Action dated Jan. 20, 2017 in related Application.].
Theodoropoulos, Gabriel; "Using Gesture Recognizers to Handle Pinch, Rotate, Pan, Swipe, and Tap Gestures" dated Aug. 25, 2014, 34 pages, [Examiner Cited Art in Office Action dated Jan. 20, 2017 in related Application.].
Boavida et al., "Dam monitoring using combined terrestrial imaging systems", 2009 Civil Engineering Survey De/Jan. 2009, pp. 33-38 {Cited in Notice of Allowance dated Sep. 15, 2017 in realted matter}.
Ralph Grabowski, "Smothing 3D Mesh Objects," New Commands in AutoCAD 2010: Part 11, Examiner Cited art in related matter Non Final Office Action dated May 19, 2017; 6 pages.
Wikipedia, "Microlens", Downloaded from https://en.wikipedia.org/wiki/Microlens, pp. 3. {Feb. 9, 2017 Final Office Action in related matter}.
Fukaya et al., "Characteristics of Speckle Random Pattern and Its Applications", pp. 317-327, Nouv. Rev. Optique, t.6, n.6. (1975) {Feb. 9, 2017 Final Office Action in related matter: downloaded Mar. 2, 2017 from http://iopscience.iop.org}.
Thorlabs, Examiner Cited NPL in Advisory Action dated Apr. 12, 2017 in related commonly owned application, downloaded from https://www.thorlabs.com/newgrouppage9.cfm?objectgroup_id= 6430, 4 pages.
EKSMA Optics, Examiner Cited NPL in Advisory Action dated Apr. 12, 2017 in related commonly owned application, downloaded from http://eksmaoptics.com/optical-systems/f-theta-lenses/f-theta-lens-for-1064-nm/, 2 pages.
Sill Optics, Examiner Cited NPL in Advisory Action dated Apr. 12, 2017 in related commonly owned application, http://www.silloptics.de/1/products/sill-encyclopedia/laser-optics/f-theta-lenses/, 4 pages.
Office Action in counterpart European Application No. 13186043.9 dated Sep. 30, 2015, pp. 1-7.
Lloyd et al., "System for Monitoring the Condition of Packages Throughout Transit", U.S. Appl. No. 14/865,575, filed Sep. 25, 2015, 59 pages, not yet published.
McCloskey et al., "Image Transformation for Indicia Reading," U.S. Appl. No. 14/928,032, filed Oct. 30, 2015, 48 pages, not yet published.
Great Britain Combined Search and Examination Report in related Application GB1517842.9, dated Apr. 8, 2016, 8 pages.
Search Report in counterpart European Application No. 15182675.7, dated Dec. 4, 2015, 10 pages.
Wikipedia, "3D projection" Downloaded on Nov. 25, 2015 from www.wikipedia.com, 4 pages.
M.Zahid Gurbuz, Selim Akyokus, Ibrahim Emiroglu, Aysun Guran, An Efficient Algorithm for 3D Rectangular Box Packing, 2009, Applied Automatic Systems: Proceedings of Selected AAS 2009 Papers, pp. 131-134.
European Extended Search Report in Related EP Application No. 16172995.9, dated Aug. 22, 2016, 11 pages.
European Extended search report in related EP Application No. 15190306.9, dated Sep. 9, 2016, 15 pages.
Collings et al., "The Applications and Technology of Phase-Only Liquid Crystal on Silicon Devices", Journal of Display Technology, IEEE Service Center, New, York, NY, US, vol. 7, No. 3, Mar. 1, 2011 (Mar. 1, 2011), pp. 112-119.
European extended Search report in related EP Application 13785171.3, dated Sep. 19, 2016, 8 pages.
El-Hakim et al., "Multicamera vision-based approach to flexible feature measurement for inspection and reverse engineering", published in Optical Engineering, Society of Photo-Optical Instrumentation Engineers, vol. 32, No. 9, Sep. 1, 1993, 15 pages.
El-Hakim et al., "A Knowledge-based Edge/Object Measurement Technique", Retrieved from the Internet: URL: https://www.researchgate.net/profile/Sabry_E1 -Hakim/publication/44075058_A_Knowledge_Based_EdgeObject_Measurement_Technique/links/00b4953b5faa7d3304000000.pdf [retrieved on Jul. 15, 2016] dated Jan. 1, 1993, 9 pages.
H. Sprague Ackley, "Automatic Mode Switching in a Volume Dimensioner", U.S. Appl. No. 15/182,636, filed Jun. 15, 2016, 53 pages, Not yet published.
Bosch Tool Corporation, "Operating/Safety Instruction for DLR 130", Dated Feb. 2, 2009, 36 pages.
European Search Report for related EP Application No. 16152477.2, dated May 24, 2016, 8 pages.
Mike Stensvold, "get the Most Out of Variable Aperture Lenses", published on www.OutdoorPhotogrpaher.com; dated Dec. 7, 2010; 4 pages, [As noted on search report retrieved from URL: http://www.outdoorphotographer.com/gear/lenses/get-the-most-out-ofvariable-aperture-lenses.html on Feb. 9, 2016].

(56) References Cited

OTHER PUBLICATIONS

Houle et al., "Vehical Positioning and Object Avoidance", U.S. Appl. No. 15/007,522 [not yet published], filed Jan. 27, 2016, 59 pages.
United Kingdom combined Search and Examination Report in related GB Application No. 1607394.2, dated Oct. 19, 2016, 7 pages.
European Search Report from related EP Application No. 16168216.6, dated Oct. 20, 2016, 8 pages.
European Extended Search Report in related EP Application No. 17201794.9, dated Mar. 16, 2018, 10 pages [Only new art cited herein].
European Extended Search Report in related EP Application 17205030.4, dated Mar. 22, 2018, 8 pages.
European Exam Report in related EP Application 16172995.9, dated Mar. 15, 2018, 7 pages (Only new art cited herein).
United Kingdom Combined Search and Examination Report dated Mar. 21, 2018, 5 pages (Art has been previously cited).
European extended Search Report in related Application No. 17207882.6 dated Apr. 26, 2018, 10 pages.
Peter Clarke, Actuator Developer Claims Anti-Shake Breakthrough for Smartphone Cams, Electronic Engineering Times, p. 24, May 16, 2011. [Previously cited and copy provided in parent application].
Spiller, Jonathan; Object Localization Using Deformable Templates, Master's Dissertation, University of the Witwatersrand, Johannesburg, South Africa, 2007; 74 pages [Previously cited and copy provided in parent application].
Leotta, Matthew J.; Joseph L. Mundy; Predicting High Resolution Image Edges with a Generic, Adaptive, 3-D Vehicle Model; IEEE Conference on Computer Vision and Pattern Recognition, 2009; 8 pages. [Previously cited and copy provided in parent application].
European Search Report for application No. EP13186043 dated Feb. 26, 2014 (now EP2722656 (Apr. 23, 2014)): Total pp. 7 [Previously cited and copy provided in parent application].
International Search Report for PCT/US2013/039438 (WO2013166368), Oct. 1, 2013, 7 pages [Previously cited and copy provided in parent application].
Lloyd, Ryan and Scott McCloskey, "Recognition of 3D Package Shapes for Singe Camera Metrology" IEEE Winter Conference on Applications of computer Visiona, IEEE, Mar. 24, 2014, pp. 99-106, {retrieved on Jun. 16, 2014}, Authors are employees of common Applicant [Previously cited and copy provided in parent application].
European Office Action for application EP 13186043, dated Jun. 12, 2014(now EP2722656 (Apr. 23, 2014)), Total of 6 pages [Previously cited and copy provided in parent application].
Zhang, Zhaoxiang; Tieniu Tan, Kaiqi Huang, Yunhong Wang; Three-Dimensional Deformable-Model-based Localization and Recognition of Road Vehicles; IEEE Transactions on Image Processing, vol. 21, No. 1, Jan. 2012, 13 pages. [Previously cited and copy provided in parent application].
U.S. Appl. No. 14/801,023, Tyler Doomenbal et al., filed Jul. 16, 2015, not published yet, Adjusting Dimensioning Results Using Augmented Reality, 39 pages [Previously cited and copy provided in parent application].
Wikipedia, YUV description and definition, downloaded from http://www.wikipeida.org/wiki/YUV on Jun. 29, 2012, 10 pages [Previously cited and copy provided in parent application].
YUV Pixel Format, downloaded from http://www.fource.org/yuv.php on Jun. 29, 2012; 13 pages. [Previously cited and copy provided in parent application].
YUV to RGB Conversion, downloaded from http://www.fource.org/fccyvrgb.php on Jun. 29, 2012; 5 pages [Previously cited and copy provided in parent application].
Benos et al., "Semi-Automatic Dimensioning with Imager of a Portable Device," U.S. Appl. No. 61/149,912, filed Feb. 4, 2009 (now expired), 56 pages. [Previously cited and copy provided in parent application].
Dimensional Weight—Wikipedia, the Free Encyclopedia, URL=http://en.wikipedia.org/wiki/Dimensional_weight, download date Aug. 1, 2008, 2 pages. [Previously cited and copy provided in parent application].
Dimensioning—Wikipedia, the Free Encyclopedia, URL=http://en.wikipedia.org/wiki/Dimensioning, download date Aug. 1, 2008, 1 page [Previously cited and copy provided in parent application].
European Patent Office Action for Application No. 14157971.4-1906, dated Jul. 16, 2014, 5 pages. [Previously cited and copy provided in parent application].
European Patent Search Report for Application No. 14157971.4-1906, dated Jun. 30, 2014, 6 pages. [Previously cited and copy provided in parent application].
Caulier, Yannick et al., "A New Type of Color-Coded Light Structures for an Adapted and Rapid Determination of Joint Correspondences for 3D Reconstruction." Proc. of SPIE, vol. 8082 808232-3; 2011; 8 pages [Previously cited and copy provided in parent application].
Kazantsev, Aleksei et al. "Robust Pseudo-Random Coded Colored STructured Light Techniques for 3D Object Model Recovery"; ROSE 2008 IEEE International Workshop on Robotic and Sensors Environments (Oct. 17-18, 2008), 6 pages [Previously cited and copy provided in parent application].
Mouaddib E. et al. "Recent Progress in Structured Light in order to Solve the Correspondence Problem in Stereo Vision" Proceedings of the 1997 IEEE International Conference on Robotics and Automation, Apr. 1997; 7 pages [Previously cited and copy provided in parent application].
Proesmans, Marc et al. "Active Acquisition of 3D Shape for Moving Objects" 0-7803-3258-X/96 1996 IEEE; 4 pages [Previously cited and copy provided in parent application].
Salvi, Joaquim et al. "Pattern Codification Strategies in Structured Light Systems" published in Pattern Recognition; The Journal of the Pattern Recognition Society, Accepted Oct. 2, 2003; 23 pages [Previously cited and copy provided in parent application].
EP Search and Written Opinion Report in related matter EP Application No. 14181437.6, dated Mar. 26, 2015, 7 pages. [Previously cited and copy provided in parent application].
Hetzel, Gunter et al.; "3D Object Recognition from Range Images using Local Feature Histograms,", Proceedings 2OO1 IEEE Conference on Computer Vision and Pattern Recognition. CVPR 2001. Kauai, Hawaii, Dec. 8-14, 2001; pp. 394-399, XP010584149, ISBN: 978-0-7695-1272-3. [Previously cited and copy provided in parent application].
Second Chinese Office Action in related CN Application No. 201520810685.6, dated Mar. 22, 2016, 5 pages, no references. [Previously cited and copy provided in parent application].
European Search Report in related EP Application No. 15190315.0, dated Apr. 1, 2016, 7 pages [Previously cited and copy provided in parent application].
Second Chinese Office Action in related CN Application No. 2015220810562.2, dated Mar. 22, 2016, 5 pages. English Translation provided [No references] [Previously cited and copy provided in parent application].
European Search Report for related Application EP 15190249.1, dated Mar. 22, 2016, 7 pages. [Previously cited and copy provided in parent application].
Second Chinese Office Action in related CN Application No. 201520810313.3, dated Mar. 22, 2016, 5 pages. English Translation provided [No references].
U.S. Appl. No. 14/800,757, Eric Todeschini, filed Jul. 16, 2015, not published yet, Dimensioning and Imaging Items, 80 pages [Previously cited and copy provided in parent application].
U.S. Appl. No. 14/747,197, Serge Thuries et al., filed Jun. 23, 2015, not published yet, Optical Pattern Projector; 33 pages [Previously cited and copy provided in parent application].
U.S. Appl. No. 14/747,490, Brian L. Jovanovski et al., Jun. 23, filed 2015, not published yet, Dual-Projector Three-Dimensional Scanner; 40 pages [Previously cited and copy provided in parent application].
Search Report and Opinion in related GB Application No. 1517112.7, dated Feb. 19, 2016, 6 Pages [Previously cited and copy provided in parent application].

(56) References Cited

OTHER PUBLICATIONS

U.S. Appl. No. 14/793,149, H. Sprague Ackley, filed Jul. 7, 2015, not published yet, Mobile Dimensioner Apparatus for Use in Commerce; 57 pages [Previously cited and copy provided in parent application].
U.S. Appl. No. 14/740,373, H. Sprague Ackley et al., filed Jun. 16, 2015, not published yet, Calibrating a Volume Dimensioner; 63 pages [Previously cited and copy provided in parent application].
Intention to Grant in counterpart European Application No. 14157971.4 dated Apr. 14, 2015, pp. 1-8 [Previously cited and copy provided in parent application].
Decision to Grant in counterpart European Application No. 14157971.4 dated Aug. 6, 2015, pp. 1-2 [Previously cited and copy provided in parent application].
Leotta, Matthew, Generic, Deformable Models for 3-D Vehicle Surveillance, May 2010, Doctoral Dissertation, Brown University, Providence RI, 248 pages [Previously cited and copy provided in parent application].
Ward, Benjamin, Interactive 3D Reconstruction from Video, Aug. 2012, Doctoral Thesis, Univesity of Adelaide, Adelaide, South Australia, 157 pages [Previously cited and copy provided in parent application].
Hood, Frederick W.; William A. Hoff, Robert King, Evaluation of an Interactive Technique for Creating Site Models from Range Data, Apr. 27-May 1, 1997 Proceedings of the ANS 7th Topical Meeting on Robotics & Remote Systems, Augusta GA, 9 pages [Previously cited and copy provided in parent application].
Gupta, Alok; Range Image Segmentation for 3-D Objects Recognition, May 1988, Technical Reports (CIS), Paper 736, University of Pennsylvania Department of Computer and Information Science, retrieved from Http://repository.upenn.edu/cis_reports/736, Accessed May 31, 2015, 157 pages [Previously cited and copy provided in parent application].
Reisner-Kollmann,Irene; Anton L. Fuhrmann, Werner Purgathofer, Interactive Reconstruction of Industrial Sites Using Parametric Models, May 2010, Proceedings of the 26th Spring Conference of Computer Graphics SCCG "10, 8 pages [Previously cited and copy provided in parent application].
Drummond, Tom; Roberto Cipolla, Real-Time Visual Tracking of Complex Structures, Jul. 2002, IEEE Transactions on Pattern Analysis and Machine Intelligence, vol. 24, No. 7; 15 pages. [Previously cited and copy provided in parent application].
European Search Report for Related EP Application No. 15189214.8, dated Mar. 3, 2016, 9 pages [Previously cited and copy provided in parent application].
Santolaria et al. "A one-step intrinsic and extrinsic calibration method for laster line scanner operation in coordinate measuring machines", dated Apr. 1, 2009, Measurement Science and Technology, IOP, Bristol, GB, vol. 20, No. 4; 12 pages [Previously cited and copy provided in parent application].
Search Report and Opinion in Related EP Application 15176943.7, dated Jan. 8, 2016, 8 pages [Previously cited and copy provided in parent application].
European Search Report for related EP Application No. 15188440.0, dated Mar. 8, 2016, 8 pages. [Previously cited and copy provided in parent application].
United Kingdom Search Report in related application GB1517842.9, dated Apr. 8, 2016, 8 pages [Previously cited and copy provided in parent application].
Great Britain Search Report for related Application On. GB1517843.7, dated Feb. 23, 2016; 8 pages [Previously cited and copy provided in parent application].
European Extended Search Report in related EP Application No. 16190017.0, dated Jan. 4, 2017, 6 pages.
European Extended Search Report in related EP Application No. 16173429.8, dated Dec. 1, 2016, 8 pages [US 2013/0038881 cited on separate IDS filed concurrently herewith].
Extended European Search Report in related EP Application No. 16175410.0, dated Dec. 13, 2016, 5 pages.
European extended search report in related EP Application 16190833.0, dated Mar. 9, 2017, 8 pages [US Publication 2014/0034731 cited on separate IDS filed concurrently herewith].
United Kingdom Combined Search and Examination Report in related Application No. GB1620676.5, dated Mar. 8, 2017, 6 pages [References cited on separate IDS filed concurrently herewith.
European Exam Report in related , EP Application No. 16168216.6, dated Feb. 27, 2017, 5 pages, [cited on separate IDS filed concurrently herewith; WO2011/017241 and US 2014/0104413].
EP Search Report in related EP Application No. 17171844 dated Sep. 18, 2017. 4 pages [Only new art cited herein; some art has been cited on separate IDS filed concurrently herewith}.
EP Extended Search Report in related EP Applicaton No. 17174843.7 dated Oct. 17, 2017, 5 pages {Only new art cited herein; some art has been cited on separate IDS filed concurrently herewith}.
UK Further Exam Report in related UK Application No. GB1517842.9, dated Sep. 1, 2017, 5 pages (only new art cited herein; some art cited on separate IDS filed concurrently herewith).
European Exam Report in related EP Application No. 15176943.7, dated Apr. 12, 2017, 6 pages [Art cited on separate IDS filed concurrently herewith].
European Exam Report in related EP Application No. 15188440.0, dated Apr. 21, 2017, 4 pages [Art has been cited on separate IDS filed concurrently herewith.].
European Examination report in related EP Application No. 14181437.6, dated Feb. 8, 2017, 5 pages [References cited on separate IDS filed concurrently herewith].
Chinese Notice of Reexamination in related Chinese Application 201520810313.3, dated Mar. 14, 2017, English Computer Translation provided, 7 pages [References cited on separate IDS filed concurrently herewith].
Extended European search report in related EP Application 16199707.7, dated Apr. 10, 2017, 15 pages.
Ulusoy et al., One-Shot Scanning using De Bruijn Spaced Grids, 2009 IEEE 12th International Conference on Computer Vision Workshops, ICCV Workshops, 7 pages [Cited in EP Extended search report dated Apr. 10, 2017.
European Exam Report in related EP Application No. 16152477.2, dated Jun. 20, 2017, 4 pages [References cited on separate IDS filed concurrently herewith].
European Exam Report in related EP Applciation 16172995.9, dated Jul. 6, 2017, 9 pages [References cited on separate IDS filed concurrently herewith].
United Kingdom Search Report in related Application No. GB1700338.5, dated Jun. 30, 2017, 5 pages.
European Search Report in related EP Application No. 17175357.7, dated Aug. 17, 2017, pp. 1-7 [References cited on separate IDS filed concurrently herewith].
United Kingdom Further Exam Report in related application GB1607394.2 dated Oct. 5, 2018; 5 pages {Only new art cited here in].
European Extended Search Report in related EP application 18184864.9, dated Oct. 30, 2018, 7 pages.
Combined Search and Examination Report in related UK Application No. GB1817189.2 dated Nov. 14, 2018, pp. 1-4 [Reference previously cited.]
Examination Report in related UK Application No. GB1517842.9 dated Dec. 21, 2018, pp. 1-7 [All references previously cited.]
United Kingdom Further Examination Report in related GB Patent Application No. 1517842.9 dated Jul. 26, 2018; 5 pages [Cited art has been previously cited in this matter].
United Kingdom Further Examination Report in related GB Patent Application No. 1517112.7 dated Jul. 17, 2018; 4 pages [No art cited].
United Kingdom Further Examination Report in related GB Patent Application No. 1620676.5 dated Jul. 17, 2018; 4 pages [No art cited].

\* cited by examiner

OPTICAL PATTERN PROJECTOR

CROSS-REFERENCE TO RELATED APPLICATIONS

The present application claims the benefit of U.S. patent application Ser. No. 14/747,197, filed on Jun. 23, 2015 and published as U.S. Pub. No. 2016/0377414 on Dec. 29, 2016. The patent application and patent publication are each hereby incorporated by reference in their entirety.

FIELD OF THE INVENTION

The present invention relates to optical dimensioning systems and, more specifically, to an optical pattern projector used for projecting a structured-light pattern onto an object for dimensioning.

BACKGROUND

Optical dimensioning systems measure the dimensions and/or volume of an item (e.g., a package for shipment) automatically and with no manual measurements. One approach to optical dimensioning requires the projection of an optical pattern (i.e., structured light) onto the object being measured. Digital images of the object and the reflected pattern may be captured and analyzed to determine the item's physical dimensions.

An optical pattern projector creates and projects the optical pattern necessary for dimensioning. The optical pattern typically includes repeating patterns (i.e., sub-patterns) of light spots (i.e., dots). A variety of methods to form the repeating optical pattern exists.

One method uses a single laser and two diffractive optical elements (i.e., DOE's). Here, the laser generates a laser beam that is directed at the first DOE to create a sub-pattern. Next, light from the first DOE is directed at a second DOE, which replicates the sub-pattern to form the repeating optical pattern.

Another method to create the optical pattern uses a custom laser array to form the sub-pattern of light. Light from the custom laser array is directed at a DOE to replicate the sub-pattern and form the optical pattern.

The methods thus far described have similar drawbacks. The use of two DOE's and the use of a custom laser array increase the cost and complexity of the optical pattern projector. A need, therefore, exists for a simpler optical pattern projector for structured-light dimensioning.

SUMMARY

Optical Pattern Projector

Accordingly, in one aspect, the present invention embraces an optical pattern projector for projecting an optical pattern onto an object. The optical pattern projector includes a laser array, a lenslet array, a lens, and a diffractive optical element (DOE).

The optical pattern projector's laser array includes a plurality of lasers. The lasers are arranged in an equal-spaced, grid pattern. The lasers are configured to radiate light in the same direction, and in one exemplary embodiment, the laser array is an array of vertical cavity surface emitting lasers (VCSELs). In another embodiment, the laser array may include over 100 VCSELs. In still another exemplary embodiment, the lasers radiate infrared light.

The optical pattern projector's lenslet array includes a plurality of lenslets arranged so that each lenslet is aligned with a particular laser. The lenslet array is positioned in front of the laser array to focus the radiated light from the lasers into a plurality of collimated laser beams. In an exemplary embodiment, a lenslet includes more than one optical element.

The optical pattern projector's lens is positioned in front of the lenslet array and is sufficiently large (i.e., has a diameter large enough) to receive all of the laser beams. The lens redirects each laser beam along a particular incident angle determined by the laser beam's spatial position in the grid pattern. In an exemplary embodiment, the lens is an f-theta lens.

The optical pattern projector's DOE is positioned in front of the lens. The DOE receives all of the laser beams and, for each laser beam, creates a sub-pattern. The DOE projects each sub-pattern along a particular angle determined by the particular laser beam's incident angle.

The sub-patterns are projected onto a target (i.e., object, item, etc.), where they combine to form an optical pattern. In an exemplary embodiment, the sub-patterns are identical. In another exemplary embodiment, the sub-patterns are arranged according to the grid pattern. In still another exemplary embodiment, the sub-pattern includes a non-uniform pattern of light spots, and in some cases, the sub-pattern includes 3-15 light spots.

Structured-Light Dimensioning System

In another aspect, the present invention embraces a structured-light dimensioning system for determining the dimensions of an object. The dimensioning system includes an optical pattern projector, an imaging subsystem, and a range mapping subsystem. In an exemplary embodiment, the structured-light dimensioning system is handheld.

The dimensioning system's optical pattern projector projects a structured-light pattern onto an object. The optical projector includes a laser array, a lenslet array, a lens, and a DOE.

The optical pattern projector's laser array includes a plurality of equally spaced lasers arranged in a grid pattern. The lasers array is configured so each laser radiates light in the same direction. In an exemplary embodiment, the light radiated from the laser array is infrared light. In another exemplary embodiment, the laser array is an array of vertical cavity surface emitting lasers (VCSELs).

The optical pattern projector's lenslet array includes a plurality of lenslets, each lenslet positioned in front of one laser in the laser array. The lenslets focus the radiated light form the lasers into a plurality of collimated beams. In an exemplary embodiment, the lenslets include more than one optical element.

The optical pattern projector's lens is positioned in front of the lenslet array. The lens is large enough to receive all of the laser beams. The lens redirects each laser beam along a particular incident angle, wherein a particular incident angle is determined by the lasers beam's spatial position within the grid array. In an exemplary embodiment, the lens is an f-theta lens.

The optical pattern projector's DOE is positioned in front of the lens. The DOE creates a sub-pattern for each laser beam and projects each sub-pattern towards the object along a particular angle determined by the particular incident angle of the laser beam. In other words, a particular laser beam's position in the laser array determines the angle at which a particular sub-pattern is projected.

The sub-patterns combine to form the structured-light pattern. In an exemplary embodiment, the structured-light pattern is the combination of sub-patterns arranged according to a square grid. In another exemplary embodiment, the sub-patterns in the structured-light pattern do not overlap. In still another exemplary embodiment, each sub-pattern includes 3 to 15 spots of light.

The dimensioning system's imaging subsystem captures images of the structured-light pattern transmitted by the optical pattern projector and reflected from the object.

The dimensioning system's range mapping subsystem includes a processor that is communicatively coupled to the imaging subsystem. The processor is configured to receive an imaged captured by the imaging system and evaluate the structured-light pattern in the image. From the evaluation, the range of each pixel in the captured image is obtained. Using the range for each pixel, the dimensions of the object are determined.

Method for Creating a Repeating Optical Pattern

In another aspect, the present invention embraces a method for creating a repeating optical pattern. The method includes the step of projecting light from a laser array. The laser array includes a square grid of co-directed lasers. The method also includes the step of collimating the light from each laser with a lenslet. The lenslet is part of a lenslet array that functions to form a set of co-directed laser beams arranged according the square grid. The method also includes the step of focusing the light from each laser beam onto a DOE using an f-theta lens. The f-theta lens focuses each laser beam along a particular incident angle determined by the laser beam's position in the square grid. Finally, the method includes the step of diffracting the light from each laser beam to form a sub-pattern. Each sub-pattern propagates along a particular angle that is determine by the incident angle of the particular laser beam. In this way, the sub-patterns combine to form a repeating optical pattern. In an exemplary embodiment, the sub-patterns are arranged according to a square grid.

The foregoing illustrative summary, as well as other exemplary objectives and/or advantages of the invention, and the manner in which the same are accomplished, are further explained within the following detailed description and its accompanying drawings.

DETAILED DESCRIPTION

Figure 1:
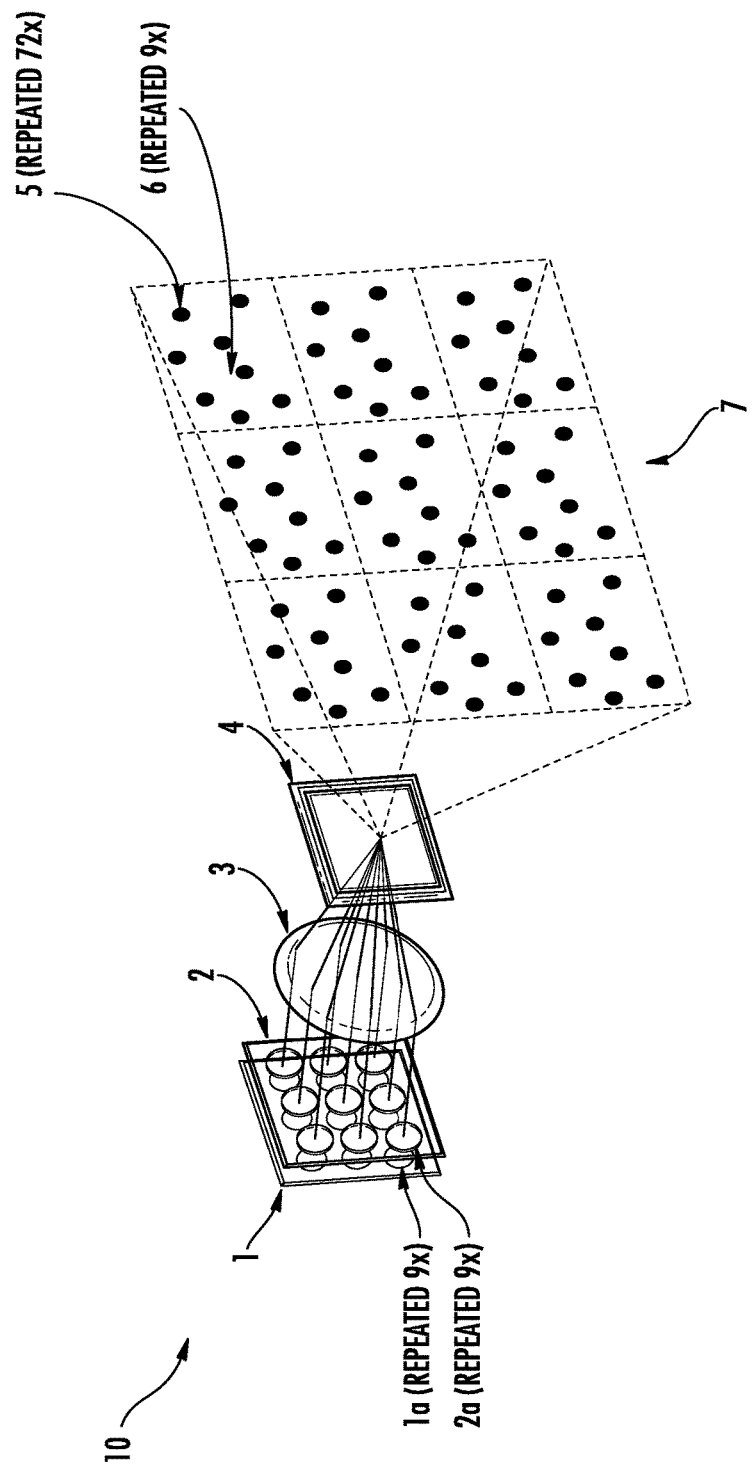
FIG. 1 graphically depicts elements of an optical pattern projector according to an exemplary embodiment of the present invention.

In one aspect, the present invention embraces an optical pattern projector for a structured-light dimensioning system that utilizes a standard laser array and a single diffractive optical element.

The exemplary optical pattern projector shown in Figure (FIG.) 1 utilizes a plurality of light sources (i.e., lasers) arranged in an array to radiate light in the same direction.

An array of vertical cavity surface emitting lasers (i.e., VCSELs) are suitable for use as the optical pattern projector's 10 laser array 1 for a few reasons. First, the VCSEL array 1 may be fabricated into a two-dimensional array using standard semiconductor materials and standard semiconductor fabrication techniques. Next, the low threshold current requirements of the VCSEL enable high-density arrays. Next, the VCSELs in the array typically radiate light in a direction that is perpendicular to the substrate (i.e., package), allowing for convenient alignment in a larger optical system. Finally, the light from a VSCEL (i.e., a "dot") is substantially circular, making it suitable for forming the optical patterns used for dimensioning.

The lasers 1a in the laser array 1 may be physically arranged in a specific geometry (e.g., rectangular grid, hexangular grid, etc.). Different array sizes are possible (e.g., 3×9) and depend on the pattern requirements for dimensioning (e.g., overall pattern size, replicated pattern frequency, etc.).

The lasers 1a in the laser array 1 are typically identical, each radiating light with a particular wavelength (e.g., 780-900 nanometers (nm)), a particular power, and (in some cases) a particular polarization.

The optical power from the laser array 1 is adjustable. For dimensioning applications, the optical power may be configured at levels considered safe for normal use at typical dimensioning ranges (e.g. 0.5-5 meters).

The lasers 1a in the laser array 1 may be electrically addressed individually or in groups and driven to generate either pulsed of continuous (i.e., CW) radiation. In an embodiment of the present invention, the lasers simultaneously radiate CW light for a period corresponding to the dimensioning process. In another embodiment of the present invention, a subset of the lasers in the laser array radiate CW light for a period corresponding to the dimensioning process.

A laser 1a in the laser array 1 typically radiates light divergently. This light may formed into a collimated laser beam using a small lens (i.e., lenslet) positioned in front of the laser. Thus a lenslet array 2 including a plurality of lenslets 2a (e.g., one for each laser) may be positioned in front of the laser array 1 to form a plurality of collimated laser beams. The laser beams are co-directed and are typically co-linear. The lenslet array 2 typically includes identical lenslets 2a. The lenslets may be discrete. While single lens elements are typical, each lenslet 2a may utilize multiple optical elements (e.g., lenses, filters, etc.). The lenslet array may be formed from a common substrate using semiconductor-processing technology. In some embodiments, an opaque film may be applied to the areas between lenslets to block stray light.

The lenslet array 2 is positioned in front of laser array 1 at a distance determined by the lenslet characteristics (e.g., f-number) and the radiated light characteristics (e.g., a full pattern angle). The positioning may be accomplished by integrating the lenslet array 3 and the laser array 1 within a common package. Alternatively, the lenslet array 3 may be positioned in front of the laser array 1 using a separate mechanical structure. Fine mechanical adjustments in position of one or more lenslets (or VCSELs) may be possible. In a possible embodiment, this adjusting of the position of one or more lenslets may be used to change the projected pattern.

A lens 3 having a diameter large enough to capture all of the collimated laser beams is positioned in front of the lenslet array 2 to focus (i.e., redirect) the collimated laser beams (i.e., laser beams). Each laser beam is redirected by the lens 3 to a particular incident angle determined by the laser-beam's position within the laser array 1.

The lens 3 focuses the laser beams onto a diffractive optical element (DOE) 4, which is positioned at (or near) the focal plane of the lens 4. In a possible embodiment, the lens 3 is an f-theta lens. An f-theta lens provides a flat field as opposed to focusing light onto a spherical plane. An f-theta lens also provides a linear mapping of position/angle. These aspects may be desirable for creating the optical pattern.

The lens 3 may be fabricated using techniques known to those skilled in the art using materials transparent to the light radiation (e.g., glass, fused silica, polycarbonate, etc.). In some embodiments, the lens maybe coated with an antireflection coating to improve throughput, reduce reflections, and/or filter stray-light.

The optical pattern projector's DOE 4 diffracts a collimated laser beam in a plurality of beams. The plurality of beams form a sub-pattern of light spots (i.e., dots) 5 on a target.

As shown in FIG. 1, the DOE 4 receives a plurality of laser beams. Each laser beam creates an identical sub-pattern (e.g., a pattern of light spots). Each sub-pattern 6 typically includes the same pattern of light spots 5. The spots in the sub-pattern may be different sizes. The sub-pattern includes the number of light spots necessary for dimensioning. For example, in one possible embodiment, the sub-pattern 6 includes 3-15 light spots. In addition, the separation between dots 5 may be chosen so that no touching dots within the sub-pattern are allowed.

Sub-patterns 6 are projected onto a target (i.e., object) and combine to form an optical pattern 7 (i.e., structured-light pattern). The optical pattern's sub-patterns may be sized so that, for ranges expected in dimensioning (e.g., 0.5 to 4.5 meters), the sub-patterns 6 do not overlap. The distribution of the spots (i.e., dots) 5 in the sub-pattern may be chosen to insure that the optical pattern 7 is symmetrical relative to the center. Further, dots at the edges of a sub-pattern may be configured so that when combined with other sub-patterns do not form touching light spots.

Figure 2:
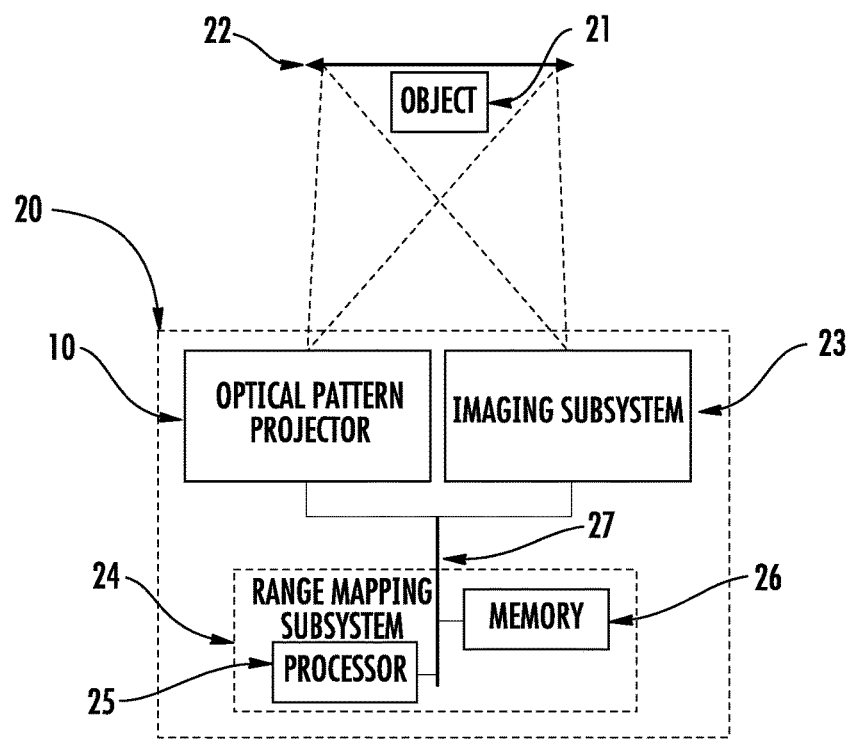
FIG. 2 schematically depicts a block diagram of a structured-light dimensioning system according to an exemplary embodiment of the present invention.

The optical pattern projector 10 thus far described may be part of a structured-light dimensioning system 20 as shown in FIG. 2. The structured-light dimensioning system 20 can measure the dimension of an object 21 (e.g., volume) placed in its field of view 22 by first projecting a known optical pattern onto the object 21.

Images of the object 21 and the optical pattern 7 may be captured using an imaging subsystem 23 positioned in proximity to the optical pattern projector (e.g., stereoscopically). The imaging subsystem 23 captures images of the object 21 and the projected light pattern 7. To accomplish this, the imaging subsystem 23 may use an imaging lens to render a real image of the imaging lens's field of view 22 onto an image sensor. This imaging lens field of view 22 overlaps at least partially with the projected light pattern 23. The image sensor may be a charge coupled device (i.e., CCD) or a sensor using complementary metal oxide semiconductor (i.e., CMOS) technology. The image sensor includes a plurality of pixels that sample the real image and convert intensity into an electronic signal.

A range mapping subsystem 24 having a processor (e.g., one or more controller, digital signal processor (DSP), application specific integrated circuit (ASIC), programmable gate array (PGA), and/or programmable logic controller (PLC)) configured by processor-executable instructions (i.e., software) stored in at least one non-transitory storage medium (i.e., memory) 26 (e.g., read-only memory (ROM), flash memory, and/or a hard-drive), can processes the captured images and measure any distortions to the optical pattern 7 (e.g., distortions to the pattern caused by the object). The distortions to the optical pattern may analyzed to produce a range image. A range image has pixels that spatially match the field of view, like an image, but that have grayscale values that correlate with range. The range image may be processed to determine the dimensions of the object 21.

The subsystems in the structured-light dimensioning system are connected via a couplers (e.g., wires or fibers), buses, and control lines to form an interconnection subsystem 27 that allows communication and interaction.

Figure 3:
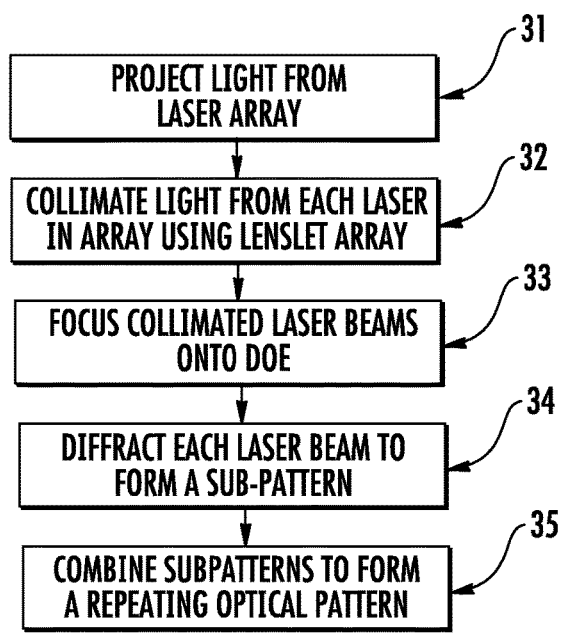
FIG. 3 depicts a flow chart of a method for creating a repeating optical pattern according to an exemplary embodiment of the present invention.

A method for creating a repeating optical pattern according to an exemplary embodiment of the present invention is shown in FIG. 3. The method includes the step of projecting light from a laser array 31. The laser array includes a square grid of co-directed lasers. The method also includes the step of collimating the light from each laser with a lenslet array 32. The method also includes the step of focusing the light from each laser beam onto a DOE using an f-theta lens 33. The f-theta lens focuses each laser beam along a particular incident angle determined by the laser beam's position in the square grid. Finally, the method includes the step of diffracting the light from each laser beam to form a sub-pattern 34. Each sub-pattern propagates along a particular angle that is determine by the incident angle of the particular laser beam. The sub-patterns combine to form a repeating optical pattern 35.

To supplement the present disclosure, this application incorporates entirely by reference the following commonly assigned patents, patent application publications, and patent applications:
To supplement the present disclosure, this application incorporates entirely by reference the following patents, patent application publications, and patent applications:
U.S. Pat. No. 6,832,725; U.S. Pat. No. 7,128,266;
U.S. Pat. No. 7,159,783; U.S. Pat. No. 7,413,127;
U.S. Pat. No. 7,726,575; U.S. Pat. No. 8,294,969;
U.S. Pat. No. 8,317,105; U.S. Pat. No. 8,322,622;
U.S. Pat. No. 8,366,005; U.S. Pat. No. 8,371,507;
U.S. Pat. No. 8,376,233; U.S. Pat. No. 8,381,979;
U.S. Pat. No. 8,390,909; U.S. Pat. No. 8,408,464;
U.S. Pat. No. 8,408,468; U.S. Pat. No. 8,408,469;
U.S. Pat. No. 8,424,768; U.S. Pat. No. 8,448,863;
U.S. Pat. No. 8,457,013; U.S. Pat. No. 8,459,557;
U.S. Pat. No. 8,469,272; U.S. Pat. No. 8,474,712;
U.S. Pat. No. 8,479,992; U.S. Pat. No. 8,490,877;
U.S. Pat. No. 8,517,271; U.S. Pat. No. 8,523,076;
U.S. Pat. No. 8,528,818; U.S. Pat. No. 8,544,737;
U.S. Pat. No. 8,548,242; U.S. Pat. No. 8,548,420;
U.S. Pat. No. 8,550,335; U.S. Pat. No. 8,550,354;
U.S. Pat. No. 8,550,357; U.S. Pat. No. 8,556,174;
U.S. Pat. No. 8,556,176; U.S. Pat. No. 8,556,177;
U.S. Pat. No. 8,559,767; U.S. Pat. No. 8,599,957;
U.S. Pat. No. 8,561,895; U.S. Pat. No. 8,561,903;
U.S. Pat. No. 8,561,905; U.S. Pat. No. 8,565,107;
U.S. Pat. No. 8,571,307; U.S. Pat. No. 8,579,200;
U.S. Pat. No. 8,583,924; U.S. Pat. No. 8,584,945;
U.S. Pat. No. 8,587,595; U.S. Pat. No. 8,587,697;
U.S. Pat. No. 8,588,869; U.S. Pat. No. 8,590,789;
U.S. Pat. No. 8,596,539; U.S. Pat. No. 8,596,542;
U.S. Pat. No. 8,596,543; U.S. Pat. No. 8,599,271;
U.S. Pat. No. 8,599,957; U.S. Pat. No. 8,600,158;
U.S. Pat. No. 8,600,167; U.S. Pat. No. 8,602,309;
U.S. Pat. No. 8,608,053; U.S. Pat. No. 8,608,071;
U.S. Pat. No. 8,611,309; U.S. Pat. No. 8,615,487;
U.S. Pat. No. 8,616,454; U.S. Pat. No. 8,621,123;
U.S. Pat. No. 8,622,303; U.S. Pat. No. 8,628,013;
U.S. Pat. No. 8,628,015; U.S. Pat. No. 8,628,016;
U.S. Pat. No. 8,629,926; U.S. Pat. No. 8,630,491;
U.S. Pat. No. 8,635,309; U.S. Pat. No. 8,636,200;
U.S. Pat. No. 8,636,212; U.S. Pat. No. 8,636,215;

U.S. Pat. No. 8,636,224; U.S. Pat. No. 8,638,806;
U.S. Pat. No. 8,640,958; U.S. Pat. No. 8,640,960;
U.S. Pat. No. 8,643,717; U.S. Pat. No. 8,646,692;
U.S. Pat. No. 8,646,694; U.S. Pat. No. 8,657,200;
U.S. Pat. No. 8,659,397; U.S. Pat. No. 8,668,149;
U.S. Pat. No. 8,678,285; U.S. Pat. No. 8,678,286;
U.S. Pat. No. 8,682,077; U.S. Pat. No. 8,687,282;
U.S. Pat. No. 8,692,927; U.S. Pat. No. 8,695,880;
U.S. Pat. No. 8,698,949; U.S. Pat. No. 8,717,494;
U.S. Pat. No. 8,717,494; U.S. Pat. No. 8,720,783;
U.S. Pat. No. 8,723,804; U.S. Pat. No. 8,723,904;
U.S. Pat. No. 8,727,223; U.S. Pat. No. D702,237;
U.S. Pat. No. 8,740,082; U.S. Pat. No. 8,740,085;
U.S. Pat. No. 8,746,563; U.S. Pat. No. 8,750,445;
U.S. Pat. No. 8,752,766; U.S. Pat. No. 8,756,059;
U.S. Pat. No. 8,757,495; U.S. Pat. No. 8,760,563;
U.S. Pat. No. 8,763,909; U.S. Pat. No. 8,777,108;
U.S. Pat. No. 8,777,109; U.S. Pat. No. 8,779,898;
U.S. Pat. No. 8,781,520; U.S. Pat. No. 8,783,573;
U.S. Pat. No. 8,789,757; U.S. Pat. No. 8,789,758;
U.S. Pat. No. 8,789,759; U.S. Pat. No. 8,794,520;
U.S. Pat. No. 8,794,522; U.S. Pat. No. 8,794,526;
U.S. Pat. No. 8,798,367; U.S. Pat. No. 8,807,431;
U.S. Pat. No. 8,807,432; U.S. Pat. No. 8,820,630;
International Publication No. 2013/163789;
International Publication No. 2013/173985;
International Publication No. 2014/019130;
International Publication No. 2014/110495;
U.S. Pat. Application Publication No. 2008/0185432;
U.S. Pat. Application Publication No. 2009/0134221;
U.S. Pat. Application Publication No. 2010/0177080;
U.S. Pat. Application Publication No. 2010/0177076;
U.S. Pat. Application Publication No. 2010/0177707;
U.S. Pat. Application Publication No. 2010/0177749;
U.S. Pat. Application Publication No. 2011/0202554;
U.S. Pat. Application Publication No. 2012/0111946;
U.S. Pat. Application Publication No. 2012/0138685;
U.S. Pat. Application Publication No. 2012/0168511;
U.S. Pat. Application Publication No. 2012/0168512;
U.S. Pat. Application Publication No. 2012/0193423;
U.S. Pat. Application Publication No. 2012/0203647;
U.S. Pat. Application Publication No. 2012/0223141;
U.S. Pat. Application Publication No. 2012/0228382;
U.S. Pat. Application Publication No. 2012/0248188;
U.S. Pat. Application Publication No. 2013/0043312;
U.S. Pat. Application Publication No. 2013/0056285;
U.S. Pat. Application Publication No. 2013/0070322;
U.S. Pat. Application Publication No. 2013/0075168;
U.S. Pat. Application Publication No. 2013/0082104;
U.S. Pat. Application Publication No. 2013/0175341;
U.S. Pat. Application Publication No. 2013/0175343;
U.S. Pat. Application Publication No. 2013/0200158;
U.S. Pat. Application Publication No. 2013/0256418;
U.S. Pat. Application Publication No. 2013/0257744;
U.S. Pat. Application Publication No. 2013/0257759;
U.S. Pat. Application Publication No. 2013/0270346;
U.S. Pat. Application Publication No. 2013/0278425;
U.S. Pat. Application Publication No. 2013/0287258;
U.S. Pat. Application Publication No. 2013/0292475;
U.S. Pat. Application Publication No. 2013/0292477;
U.S. Pat. Application Publication No. 2013/0293539;
U.S. Pat. Application Publication No. 2013/0293540;
U.S. Pat. Application Publication No. 2013/0306728;
U.S. Pat. Application Publication No. 2013/0306730;
U.S. Pat. Application Publication No. 2013/0306731;
U.S. Pat. Application Publication No. 2013/0307964;
U.S. Pat. Application Publication No. 2013/0308625;
U.S. Pat. Application Publication No. 2013/0313324;
U.S. Pat. Application Publication No. 2013/0313325;
U.S. Pat. Application Publication No. 2013/0341399;
U.S. Pat. Application Publication No. 2013/0342717;
U.S. Pat. Application Publication No. 2014/0001267;
U.S. Pat. Application Publication No. 2014/0002828;
U.S. Pat. Application Publication No. 2014/0008430;
U.S. Pat. Application Publication No. 2014/0008439;
U.S. Pat. Application Publication No. 2014/0025584;
U.S. Pat. Application Publication No. 2014/0027518;
U.S. Pat. Application Publication No. 2014/0034734;
U.S. Pat. Application Publication No. 2014/0036848;
U.S. Pat. Application Publication No. 2014/0039693;
U.S. Pat. Application Publication No. 2014/0042814;
U.S. Pat. Application Publication No. 2014/0049120;
U.S. Pat. Application Publication No. 2014/0049635;
U.S. Pat. Application Publication No. 2014/0061305;
U.S. Pat. Application Publication No. 2014/0061306;
U.S. Pat. Application Publication No. 2014/0063289;
U.S. Pat. Application Publication No. 2014/0066136;
U.S. Pat. Application Publication No. 2014/0067692;
U.S. Pat. Application Publication No. 2014/0070005;
U.S. Pat. Application Publication No. 2014/0071840;
U.S. Pat. Application Publication No. 2014/0074746;
U.S. Pat. Application Publication No. 2014/0075846;
U.S. Pat. Application Publication No. 2014/0076974;
U.S. Pat. Application Publication No. 2014/0078341;
U.S. Pat. Application Publication No. 2014/0078342;
U.S. Pat. Application Publication No. 2014/0078345;
U.S. Pat. Application Publication No. 2014/0084068;
U.S. Pat. Application Publication No. 2014/0097249;
U.S. Pat. Application Publication No. 2014/0098792;
U.S. Pat. Application Publication No. 2014/0100774;
U.S. Pat. Application Publication No. 2014/0100813;
U.S. Pat. Application Publication No. 2014/0103115;
U.S. Pat. Application Publication No. 2014/0104413;
U.S. Pat. Application Publication No. 2014/0104414;
U.S. Pat. Application Publication No. 2014/0104416;
U.S. Pat. Application Publication No. 2014/0104451;
U.S. Pat. Application Publication No. 2014/0106594;
U.S. Pat. Application Publication No. 2014/0106725;
U.S. Pat. Application Publication No. 2014/0108010;
U.S. Pat. Application Publication No. 2014/0108402;
U.S. Pat. Application Publication No. 2014/0108682;
U.S. Pat. Application Publication No. 2014/0110485;
U.S. Pat. Application Publication No. 2014/0114530;
U.S. Pat. Application Publication No. 2014/0124577;
U.S. Pat. Application Publication No. 2014/0124579;
U.S. Pat. Application Publication No. 2014/0125842;
U.S. Pat. Application Publication No. 2014/0125853;
U.S. Pat. Application Publication No. 2014/0125999;
U.S. Pat. Application Publication No. 2014/0129378;
U.S. Pat. Application Publication No. 2014/0131438;
U.S. Pat. Application Publication No. 2014/0131441;
U.S. Pat. Application Publication No. 2014/0131443;
U.S. Pat. Application Publication No. 2014/0131444;
U.S. Pat. Application Publication No. 2014/0131445;
U.S. Pat. Application Publication No. 2014/0131448;
U.S. Pat. Application Publication No. 2014/0133379;
U.S. Pat. Application Publication No. 2014/0136208;
U.S. Pat. Application Publication No. 2014/0140585;
U.S. Pat. Application Publication No. 2014/0151453;
U.S. Pat. Application Publication No. 2014/0152882;
U.S. Pat. Application Publication No. 2014/0158770;
U.S. Pat. Application Publication No. 2014/0159869;
U.S. Pat. Application Publication No. 2014/0160329;
U.S. Pat. Application Publication No. 2014/0166755;

U.S. Pat. Application Publication No. 2014/0166757;
U.S. Pat. Application Publication No. 2014/0166759;
U.S. Pat. Application Publication No. 2014/0166760;
U.S. Pat. Application Publication No. 2014/0166761;
U.S. Pat. Application Publication No. 2014/0168787;
U.S. Pat. Application Publication No. 2014/0175165;
U.S. Pat. Application Publication No. 2014/0175169;
U.S. Pat. Application Publication No. 2014/0175172;
U.S. Pat. Application Publication No. 2014/0175174;
U.S. Pat. Application Publication No. 2014/0191644;
U.S. Pat. Application Publication No. 2014/0191913;
U.S. Pat. Application Publication No. 2014/0197238;
U.S. Pat. Application Publication No. 2014/0197239;
U.S. Pat. Application Publication No. 2014/0197304;
U.S. Pat. Application Publication No. 2014/0203087;
U.S. Pat. Application Publication No. 2014/0204268;
U.S. Pat. Application Publication No. 2014/0214631;
U.S. Pat. Application Publication No. 2014/0217166;
U.S. Pat. Application Publication No. 2014/0217180;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/436,337 for an Electronic Device, filed Nov. 5, 2012 (Fitch et al.);
U.S. patent application Ser. No. 13/771,508 for an Optical Redirection Adapter, filed Feb. 20, 2013 (Anderson);
U.S. patent application Ser. No. 13/852,097 for a System and Method for Capturing and Preserving Vehicle Event Data, filed Mar. 28, 2013 (Barker et al.);
U.S. patent application Ser. No. 13/902,110 for a System and Method for Display of Information Using a Vehicle-Mount Computer, filed May 24, 2013 (Hollifield);
U.S. patent application No. 13/902,144, for a System and Method for Display of Information Using a Vehicle-Mount Computer, filed May 24, 2013 (Chamberlin);
U.S. patent application Ser. No. 13/902,242 for a System For Providing A Continuous Communication Link With A Symbol Reading Device, filed May 24, 2013 (Smith et al.);
U.S. patent application Ser. No. 13/912,262 for a Method of Error Correction for 3D Imaging Device, filed Jun. 7, 2013 (Jovanovski et al.);
U.S. patent application Ser. No. 13/912,702 for a System and Method for Reading Code Symbols at Long Range Using Source Power Control, filed Jun. 7, 2013 (Xian et al.);
U.S. patent application Ser. No. 29/458,405 for an Electronic Device, filed Jun. 19, 2013 (Fitch et al.);
U.S. patent application Ser. No. 13/922,339 for a System and Method for Reading Code Symbols Using a Variable Field of View, filed Jun. 20, 2013 (Xian et al.);
U.S. patent application Ser. No. 13/927,398 for a Code Symbol Reading System Having Adaptive Autofocus, filed Jun. 26, 2013 (Todeschini);
U.S. patent application Ser. No. 13/930,913 for a Mobile Device Having an Improved User Interface for Reading Code Symbols, filed Jun. 28, 2013 (Gelay et al.);
U.S. patent application Ser. No. 29/459,620 for an Electronic Device Enclosure, filed Jul. 2, 2013 (London et al.);
U.S. patent application Ser. No. 29/459,681 for an Electronic Device Enclosure, filed Jul. 2, 2013 (Chaney et al.);
U.S. patent application Ser. No. 13/933,415 for an Electronic Device Case, filed Jul. 2, 2013 (London et al.);
U.S. patent application Ser. No. 29/459,785 for a Scanner and Charging Base, filed Jul. 3, 2013 (Fitch et al.);
U.S. patent application Ser. No. 29/459,823 for a Scanner, filed Jul. 3, 2013 (Zhou et al.);
U.S. patent application Ser. No. 13/947,296 for a System and Method for Selectively Reading Code Symbols, filed Jul. 22, 2013 (Rueblinger et al.);
U.S. patent application Ser. No. 13/950,544 for a Code Symbol Reading System Having Adjustable Object Detection, filed Jul. 25, 2013 (Jiang);
U.S. patent application Ser. No. 13/961,408 for a Method for Manufacturing Laser Scanners, filed Aug. 7, 2013 (Saber et al.);
U.S. patent application Ser. No. 14/018,729 for a Method for Operating a Laser Scanner, filed Sep. 5, 2013 (Feng et al.);
U.S. patent application Ser. No. 14/019,616 for a Device Having Light Source to Reduce Surface Pathogens, filed Sep. 6, 2013 (Todeschini);
U.S. patent application Ser. No. 14/023,762 for a Handheld Indicia Reader Having Locking Endcap, filed Sep. 11, 2013 (Gannon);
U.S. patent application Ser. No. 14/035,474 for Augmented-Reality Signature Capture, filed Sep. 24, 2013 (Todeschini);
U.S. patent application Ser. No. 29/468,118 for an Electronic Device Case, filed Sep. 26, 2013 (Oberpriller et al.);
U.S. patent application Ser. No. 14/055,234 for Dimensioning System, filed Oct. 16, 2013 (Fletcher);
U.S. patent application Ser. No. 14/053,314 for Indicia Reader, filed Oct. 14, 2013 (Huck);
U.S. patent application Ser. No. 14/065,768 for Hybrid System and Method for Reading Indicia, filed Oct. 29, 2013 (Meier et al.);
U.S. patent application Ser. No. 14/074,746 for Self-Checkout Shopping System, filed Nov. 8, 2013 (Hejl et al.);
U.S. patent application Ser. No. 14/074,787 for Method and System for Configuring Mobile Devices via NFC Technology, filed Nov. 8, 2013 (Smith et al.);
U.S. patent application Ser. No. 14/087,190 for Optimal Range Indicators for Bar Code Validation, filed Nov. 22, 2013 (Hejl);
U.S. patent application Ser. No. 14/094,087 for Method and System for Communicating Information in an Digital Signal, filed Dec. 2, 2013 (Peake et al.);
U.S. patent application Ser. No. 14/101,965 for High Dynamic-Range Indicia Reading System, filed Dec. 10, 2013 (Xian);
U.S. patent application Ser. No. 14/150,393 for Indicia-reader Having Unitary Construction Scanner, filed Jan. 8, 2014 (Colavito et al.);
U.S. patent application Ser. No. 14/154,207 for Laser Barcode Scanner, filed Jan. 14, 2014 (Hou et al.);
U.S. patent application Ser. No. 14/165,980 for System and Method for Measuring Irregular Objects with a Single Camera filed Jan. 28, 2014 (Li et al.);
U.S. patent application Ser. No. 14/166,103 for Indicia Reading Terminal Including Optical Filter filed Jan. 28, 2014 (Lu et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 14/250,923 for Reading Apparatus Having Partial Frame Operating Mode filed Apr. 11, 2014, (Deng et al.);
U.S. patent application Ser. No. 14/257,174 for Imaging Terminal Having Data Compression filed Apr. 21, 2014, (Barber et al.);

U.S. patent application Ser. No. 14/257,364 for Docking System and Method Using Near Field Communication filed Apr. 21, 2014 (Showering);

U.S. patent application Ser. No. 14/264,173 for Autofocus Lens System for Indicia Readers filed Apr. 29, 2014 (Ackley et al.);

U.S. patent application Ser. No. 14/274,858 for Mobile Printer with Optional Battery Accessory filed May 12, 2014 (Marty et al.);

U.S. patent application Ser. No. 14/277,337 for MULTIPURPOSE OPTICAL READER, filed May 14, 2014 (Jovanovski et al.);

U.S. patent application Ser No. 14/283,282 for TERMINAL HAVING ILLUMINATION AND FOCUS CONTROL filed May 21, 2014 (Liu et al.);

U.S. patent application Ser. No. 14/300,276 for METHOD AND SYSTEM FOR CONSIDERING INFORMATION ABOUT AN EXPECTED RESPONSE WHEN PERFORMING SPEECH RECOGNITION, filed Jun. 10, 2014 (Braho et al.);

U.S. patent application Ser. No. 14/305,153 for INDICIA READING SYSTEM EMPLOYING DIGITAL GAIN CONTROL filed Jun. 16, 2014 (Xian et al.);

U.S. patent application Ser. No. 14/310,226 for AUTOFOCUSING OPTICAL IMAGING DEVICE filed Jun. 20, 2014 (Koziol et al.);

U.S. patent application Ser. No. 14/327,722 for CUSTOMER FACING IMAGING SYSTEMS AND METHODS FOR OBTAINING IMAGES filed Jul. 10, 2014 (Oberpriller et al,);

U.S. patent application Ser. No. 14/327,827 for a MOBILE-PHONE ADAPTER FOR ELECTRONIC TRANSACTIONS, filed Jul. 10, 2014 (Hejl);

U.S. patent application Ser. No. 14/329,303 for CELL PHONE READING MODE USING IMAGE TIMER filed Jul. 11, 2014 (Coyle);

U.S. patent application Ser. No. 14/333,588 for SYMBOL READING SYSTEM WITH INTEGRATED SCALE BASE filed Jul. 17, 2014 (Barten);

U.S. patent application Ser. No. 14/334,934 for a SYSTEM AND METHOD FOR INDICIA VERIFICATION, filed Jul. 18, 2014 (Hejl);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);

U.S. patent application Ser. No. 14/340,716 for an OPTICAL IMAGER AND METHOD FOR CORRELATING A MEDICATION PACKAGE WITH A PATIENT, filed Jul. 25, 2014 (Ellis);

U.S. patent application Ser. No. 14/342,544 for Imaging Based Barcode Scanner Engine with Multiple Elements Supported on a Common Printed Circuit Board filed Mar. 4, 2014 (Liu et al.);

U.S. patent application Ser. No. 14/345,735 for Optical Indicia Reading Terminal with Combined Illumination filed Mar. 19, 2014 (Ouyang);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/355,613 for Optical Indicia Reading Terminal with Color Image Sensor filed May 1, 2014 (Lu et al.);

U.S. patent application Ser. No. 14/370,237 for WEB-BASED SCAN-TASK ENABLED SYSTEM AND METHOD OF AND APPARATUS FOR DEVELOPING AND DEPLOYING THE SAME ON A CLIENT-SERVER NETWORK filed Jul. 2, 2014 (Chen et al.);

U.S. patent application Ser. No. 14/370,267 for INDUSTRIAL DESIGN FOR CONSUMER DEVICE BASED SCANNING AND MOBILITY, filed Jul. 2, 2014 (Ma et al.);

U.S. patent application Ser. No. 14/376,472, for an ENCODED INFORMATION READING TERMINAL INCLUDING HTTP SERVER, filed Aug. 4, 2014 (Lu);

U.S. patent application Ser. No. 14/379,057 for METHOD OF USING CAMERA SENSOR INTERFACE TO TRANSFER MULTIPLE CHANNELS OF SCAN DATA USING AN IMAGE FORMAT filed Aug. 15, 2014 (Wang et al.);

U.S. patent application Ser. No. 14/452,697 for INTERACTIVE INDICIA READER, filed Aug. 6, 2014 (Todeschini);

U.S. patent application Ser. No. 14/453,019 for DIMENSIONING SYSTEM WITH GUIDED ALIGNMENT, filed Aug. 6, 2014 (Li et al.);

U.S. patent application Ser. No. 14/460,387 for APPARATUS FOR DISPLAYING BAR CODES FROM LIGHT EMITTING DISPLAY SURFACES filed Aug. 15, 2014 (Van Horn et al.);

U.S. patent application Ser No. 14/460,829 for ENCODED INFORMATION READING TERMINAL WITH WIRELESS PATH SELECTON CAPABILITY, filed Aug. 15, 2014 (Wang et al.);

U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No. 14/446,387 for INDICIA READING TERMINAL PROCESSING PLURALITY OF FRAMES OF IMAGE DATA RESPONSIVELY TO TRIGGER SIGNAL ACTIVATION filed Jul. 30, 2014 (Wang et al.);

U.S. patent application Ser. No. 14/446,391 for MULTIFUNCTION POINT OF SALE APPARATUS WITH OPTICAL SIGNATURE CAPTURE filed Jul. 30, 2014 (Good et al.);

U.S. patent application Ser. No. 29/486,759 for an Imaging Terminal, filed Apr. 2, 2014 (Oberpriller et al.);

U.S. patent application Ser. No. 29/492,903 for an INDICIA SCANNER, filed Jun. 4, 2014 (Zhou et al.); and U.S. patent application Ser. No. 29/494,725 for an IN-COUNTER BARCODE SCANNER, filed Jun. 24, 2014 (Oberpriller et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. An optical pattern projector, comprising:
 a laser array comprising a plurality of lasers spaced in a grid, each of the plurality of lasers configured to radiate light;

a plurality of lenslets configured and arranged with respect to the laser array to collimate the radiated light from the plurality of lasers, providing a plurality of collimated laser beams;

an f-theta lens configured and arranged with respect to the plurality of lenslets to receive the collimated laser beams and to focus each of the plurality of collimated laser beams along a particular incident angle, each respective particular incident angle determined by the position in the grid of the laser corresponding to the respective laser beam; and a diffractive optical element (DOE) configured and arranged with respect to the f-theta lens to, for each collimated laser beam, diffract the collimated laser beam to form a sub-pattern comprising a plurality of beam portions derived from the collimated laser beam, wherein each respective sub-pattern propagates along a resultant incident angle determined by the particular incident angle of the corresponding collimated laser beam; and wherein when projected onto a target, the sub-patterns each respectively corresponding to one of the collimated laser beams align with one another to form a repeating optical pattern comprising non-overlapping sub-patterns, and wherein the position of each sub-pattern in the repeating optical pattern depends on the resultant incident angle.

2. The optical pattern projector of claim 1, wherein when projected onto a target, each sub-pattern respectively encompasses a region defined by a perimeter of the sub-pattern, the respective regions being non-overlapping with one another.

3. The optical pattern projector of claim 1, wherein the number of beam portions in a sub-pattern depends on the diffraction effected by the DOE.

4. The optical pattern projector of claim 1, wherein each non-overlapping sub-pattern respectively originates from only one of the plurality of lasers, the repeating optical pattern consisting of N non-overlapping sub-patterns wherein N equals the number of lasers in laser array.

5. The optical pattern projector of claim 1, wherein each sub-pattern comprises an identical arrangmene of beam portions.

6. The optical pattern projector of claim 5, wherein the focusing lens comprises an f-theta lens.

7. The optical pattern projector of claim 5, wherein each of the N sub-patterns propagates along a resultant incident angle determined by the respective particular incident angle corresponding to the respective collimated laser beam, the position of each of the N sub-patterns in the repeating optical pattern depending on the respective resultant incident angle.

8. The optical pattern projector of claim 1, wherein the laser array comprises an array of vertical cavity surface emitting lasers.

9. The optical pattern projector of claim 1, wherein each sub-pattern comprises an identical arrangmene of beam portions.

10. An optical pattern projector, comprising:

an array of vertical cavity surface emitting lasers (VCSELs), the VCSELs configured to emit a plurality of collimated laser beams, the plurality being a whole number equal to N;

a focusing lens configured and arranged with respect to the VCSELs to receive the N collimated laser beams and to focus each of the N collimated laser beams along a particular incident angle, each respective particular incident angle determined by the position of the corresponding collimated laser beam when emitted from the VCSEL; and a diffractive optical element (DOE) configured and arranged with respect to the focusing lens to diffract each of the N collimated laser beams, forming N sub-patterns, each of the N sub patterns comprising a plurality of beam portions derived from the respective one of the N collimated laser beams, the plurality of beam portions being a whole number equal to Y, wherein Y depends on the diffraction effected by the DOE;

wherein when projected onto a target, the N sub-patterns align with one another without overlapping to form a repeating optical pattern.

11. A method of creating an optional pattern, the method comprising:

projecting light from each of a plurality of lasers in a laser array;

collimating the light from each of the plurality of lasers using a plurality of lenslets, the plurality of lenslets configured and arranged with respect to the laser array to provide a pluralty of collimated laser beams;

focusing each of the plurality of collimated laser beams along a particular incident angle using an f-theta lens configured and arranged with respect to the plurality of lenslets to receive the collimated laser beams and to provide the particular incident angle, the particular incident angle corresponding to a respective laser beam determined by the position in the grid of the laser corresponding to the respective laser beam;

diffracting each collimated laser beam using a diffractive optical element (DOE) to form a sub-pattern comprising a plurality of beam portions derived from the collimated laser beam, the DOE configured and arranged to propagate each respective sub-pattern along a resultant incident angle determined by the particular incident angle of the corresponding collimated laser beam; and projecting the sub-patterns onto a target, wherein the sub-patterns each respectively corresponding to one of the collimated laser beams align with one another for form a repeating optical pattern comprising non-overlapping sub-patterns, and wherein the position of each sub-pattern in the repeating optical pattern depends on the resultant incident angle.

12. The method of claim 11, wherein when projected onto a target, each sub-pattern respectively encompasses a region defined by a perimeter of the sub-pattern, the respective regions being non-overlapping with one another.

13. The method of claim 11, wherein the number of beam portions in a sub-pattern depends on the diffraction effected by the DOE.

14. The method of claim 11, wherein each non-overlapping sub-pattern respectively originates from only one of the plurality of lasers, the repeating optical pattern consisting of N non-overlapping sub-patterns wherein N equals the number of lasers in laser array.

15. The optical pattern projector of claim 11, wherein each sub-pattern comprises an identical arrangmene of beam portions.

16. The optical pattern projector of claim 11, wherein the laser array comprises an array of vertical cavity surface emitting lasers.

17. A method of creating an optional pattern, the method comprising:

emitting a plurality of collimated laser beams from an array of vertical cavity surface emitting lasers (VCSELs), the plurality being a whole number equal to N;

focusing each of the N collimated laser beams along a particular incident angle using a focusing lens configured and arranged with respect to the VCSELs to receive the N collimated laser beams, each respective particular incident angle determined by the position of the corresponding collimated laser beam when emitted from the VCSEL; and diffracting each of the N collimated laser beams using a diffractive optical element (DOE) configured and arranged with respect to the focusing to form N sub-patterns, each of the N sub patterns comprising a plurality of beam portions derived from the respective one of the N collimated laser beams, the plurality of beam portions being a whole number equal to Y, wherein Y depends on the diffraction effected by the DOE; and projecting the N sub-patterns onto a target, the N sub-patterns aligning with one another without overlapping to form a repeating optical pattern.

18. The method of claim 17, wherein the focusing lens comprises an f-theta lens.

19. The method of claim 17, wherein each of the N sub-patterns propagates along a resultant incident angle determined by the respective particular incident angle corresponding to the respective collimated laser beam, the position of each of the N sub-patterns in the repeating optical pattern depending on the respective resultant incident angle.

20. The optical pattern projector of claim 17, wherein each sub-pattern comprises an identical arrangmene of beam portions.

* * * * *